(12) United States Patent
Inoue et al.

(10) Patent No.: US 8,319,320 B2
(45) Date of Patent: Nov. 27, 2012

(54) LED MODULE

(75) Inventors: Kazuhiro Inoue, Fukuoka-ken (JP);
Kazuhisa Iwashita, Fukuoka-ken (JP);
Teruo Takeuchi, Fukuoka-ken (JP);
Tatsuo Tonedachi, Fukuoka-ken (JP);
Hiroaki Oshio, Fukuoka-ken (JP);
Tetsuro Komatsu, Fukuoka-ken (JP);
Naoya Ushiyama, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 104 days.

(21) Appl. No.: 12/874,406

(22) Filed: Sep. 2, 2010

(65) Prior Publication Data
US 2011/0193112 A1 Aug. 11, 2011

(30) Foreign Application Priority Data
Feb. 8, 2010 (JP) ................................. 2010-026005

(51) Int. Cl.
*H01L 23/495* (2006.01)
(52) U.S. Cl. ................. 257/676; 257/700; 257/E25.032; 368/241
(58) Field of Classification Search ........................ None
See application file for complete search history.

(56) References Cited

U.S. PATENT DOCUMENTS

| 2004/0188696 A1* | 9/2004 | Hsing Chen et al. ............ 257/99 |
| 2006/0049422 A1* | 3/2006 | Shoji ............................ 257/100 |
| 2007/0018191 A1* | 1/2007 | Roh et al. ...................... 257/99 |
| 2008/0083931 A1* | 4/2008 | Bando et al. .................... 257/99 |
| 2008/0298081 A1* | 12/2008 | Oon et al. ..................... 362/555 |
| 2010/0163920 A1* | 7/2010 | Itai .............................. 257/99 |
| 2011/0186868 A1 | 8/2011 | Watari et al. |
| 2011/0186901 A1 | 8/2011 | Ushiyama et al. |
| 2012/0080674 A1 | 4/2012 | Shimizu et al. |

FOREIGN PATENT DOCUMENTS

| JP | 03-087051 | 4/1991 |
| JP | 2000-512806 | 9/2000 |
| JP | 2002-232009 | 8/2002 |
| JP | 2003-110080 | 4/2003 |

(Continued)

OTHER PUBLICATIONS

Chinese Office Action for Chinese Application No. 2012080700661620 issued on Aug. 10, 2012.

*Primary Examiner* — Evan Pert
*Assistant Examiner* — Scott R Wilson
(74) *Attorney, Agent, or Firm* — Turocy & Watson, LLP

(57) ABSTRACT

According to one embodiment, an LED module includes a board, an interconnection and an LED package. The interconnection is formed on an upper surface of the board. The LED package is mounted on the board. The LED package includes first and second lead frames disposed to be apart from each other, and connected to portions of the interconnection insulated from each other. The LED package includes an LED chip provided above the first and second lead frames. The LED chip has one terminal connected to the first lead frame and another terminal connected to the second lead frame. In addition, the LED package includes a resin body covering an upper surface, portions of a lower surface and an edge surface of each of the first and second lead frames, also covering the LED chip, but exposing remaining portions of the lower surface and the edge surface. And, an appearance of the resin body is an appearance of the LED package.

17 Claims, 22 Drawing Sheets

FOREIGN PATENT DOCUMENTS

| | | |
|---|---|---|
| JP | 2004-247612 | 9/2004 |
| JP | 2006-093672 | 4/2006 |
| JP | 2006-147214 | 6/2006 |
| JP | 2007-027281 | 2/2007 |
| JP | 2007-266647 | 10/2007 |
| JP | 2008-112966 | 5/2008 |
| JP | 2008-218469 | 9/2008 |
| JP | D1375900 | 12/2009 |
| JP | D1375901 | 12/2009 |
| WO | 2008153043 | 12/2008 |

* cited by examiner

ULTRAVIOLET EXPOSURE

LED MODULE

CROSS-REFERENCE TO RELATED APPLICATIONS

This application is based upon and claims the benefit of priority from the prior Japanese Patent Application No. 2010-26005, filed on Feb. 8, 2010; the entire contents of which are incorporated herein by reference.

FIELD

Embodiments described herein relate generally to an LED (Light Emitting Diode) module.

BACKGROUND

Recently, attention has been focused on a light source device which uses an LED chip as a light source (hereinafter, referred to as an "LED light source device"). The LED light source device has advantages of a longer life and less power consumption than an incandescent light bulb and a fluorescent lamp have. However, there is a limit to the amount of light outputted from a single LED chip. For this reason, in an LED light source device, multiple LED chips are normally mounted on a flexible board to obtain a necessary amount of light (for instance, refer to JP-A 2002-232009 (Kokai)).

Nevertheless, recently the LED light source devices are required to have a higher durability because applications of LED light source devices expand. Moreover, further reduction in cost is demanded because applications of LED light source devices expand.

DETAILED DESCRIPTION

In general, according to one embodiment, an LED module includes a board, an interconnection and an LED package. The interconnection is formed on an upper surface of the board. The LED package is mounted on the board. The LED package includes first and second lead frames disposed to be apart from each other, and connected to portions of the interconnection insulated from each other. The LED package includes an LED chip provided above the first and second lead frames. The LED chip has one terminal connected to the first lead frame and another terminal connected to the second lead frame. In addition, the LED package includes a resin body covering an upper surface, a portion of a lower surface, and a portion of an edge surface of each of the first and second lead frames, also covering the LED chip, but exposing a remaining portion of the lower surface and a remaining portion of the edge surface. And, an appearance of the resin body is an appearance of the LED package.

Hereinafter, embodiments of the invention will be described with reference to the drawings.

First of all, a first embodiment will be described.

Figure 1:
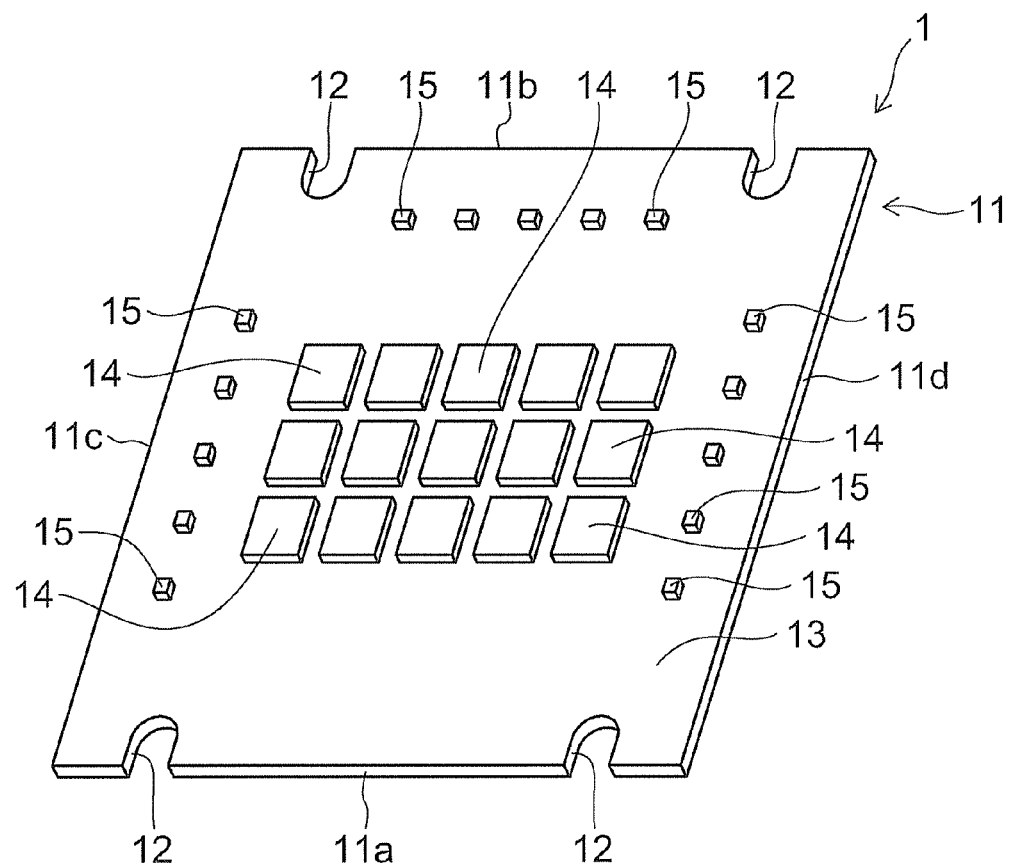
FIG. 1 is a perspective view illustrating an LED module according to a first embodiment.

FIG. 1 is a perspective view for illustrating an LED module according to this embodiment.

Figure 2:
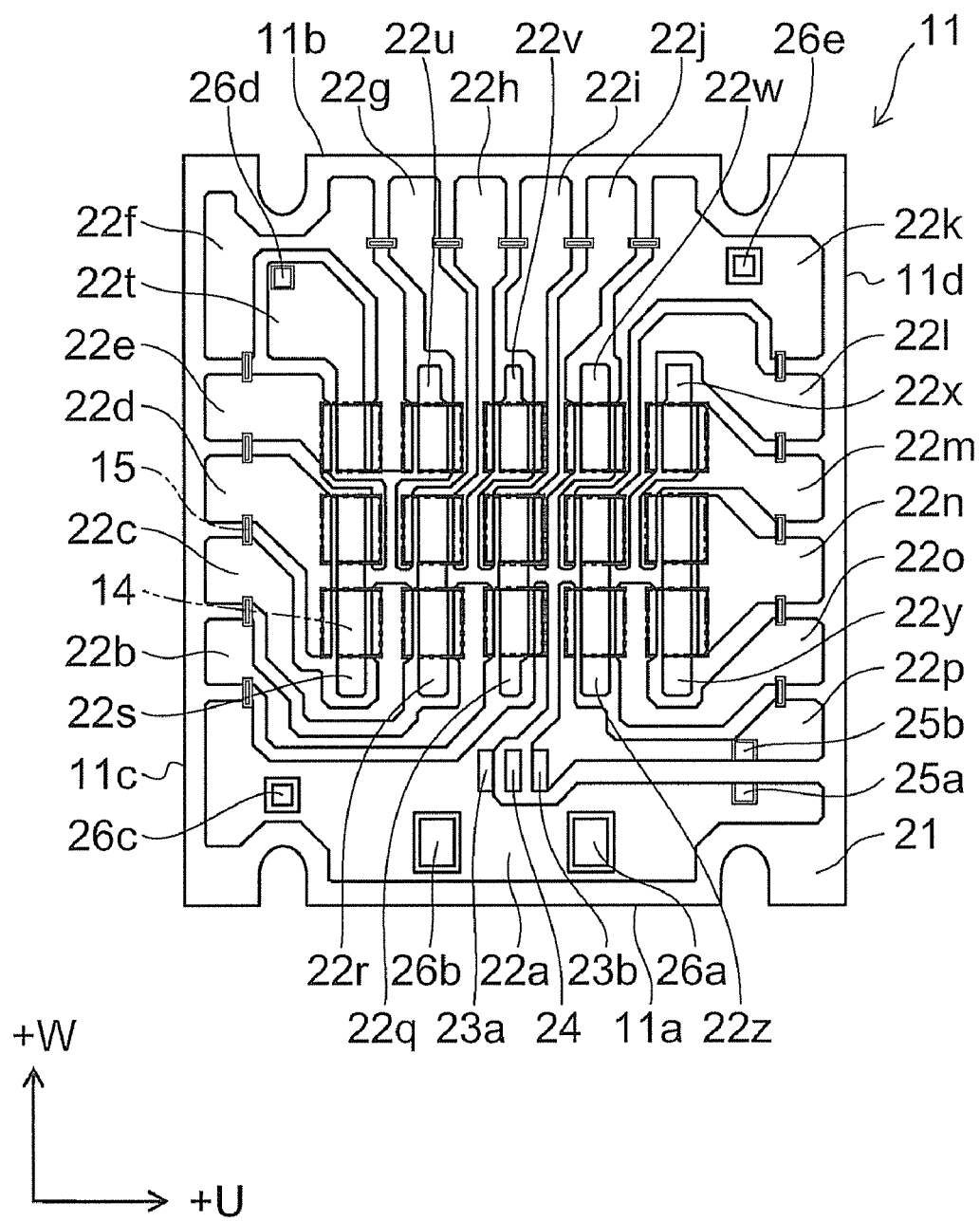
FIG. 2 is a plan view illustrating a printed board of the LED module according to the first embodiment.

FIG. 2 is a plan view for illustrating a printed board of the LED module according to this embodiment.

Figure 3:
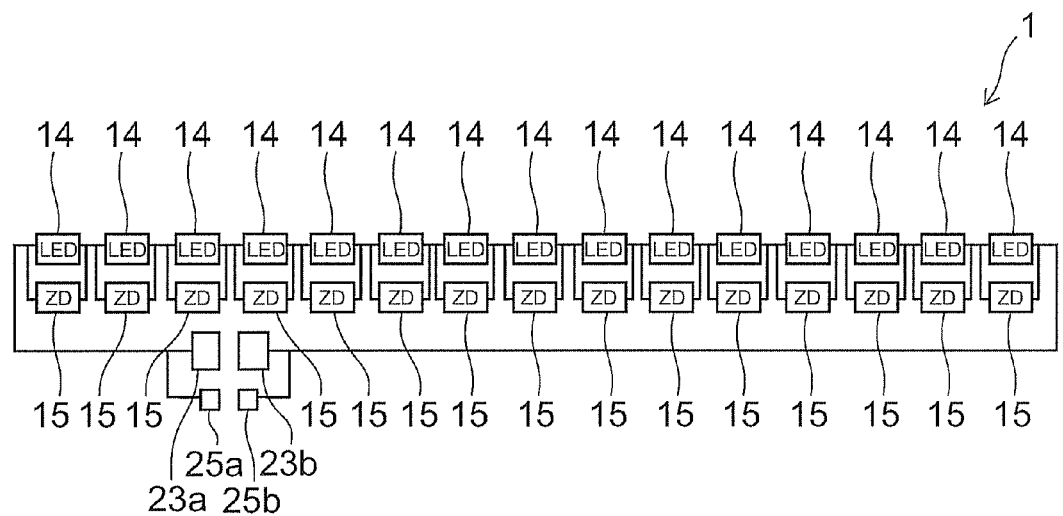
FIG. 3 is a circuit diagram illustrating the LED module according to the first embodiment.

FIG. 3 is a circuit diagram for illustrating the LED module according to this embodiment.

Figure 4:
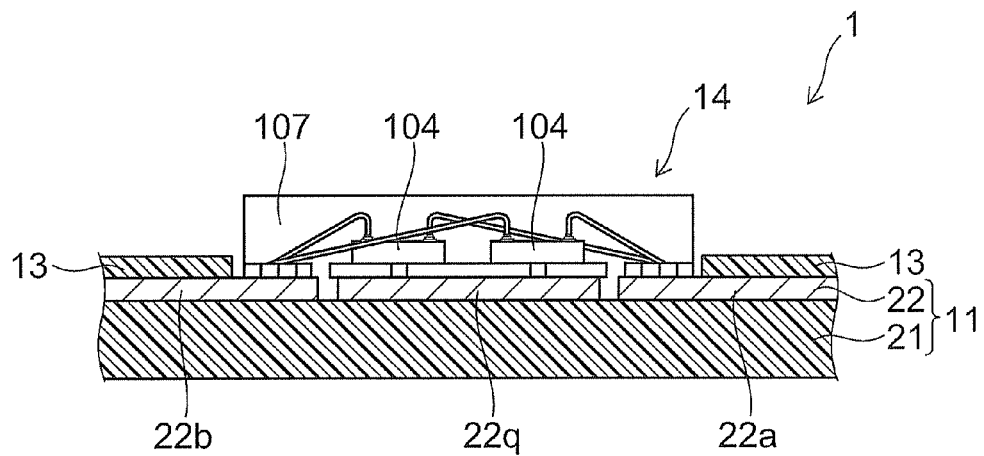
FIG. 4 is a sectional view for illustrating the LED module according to the first embodiment.

FIG. 4 is a sectional view for illustrating the LED module according to this embodiment.

Figure 5:
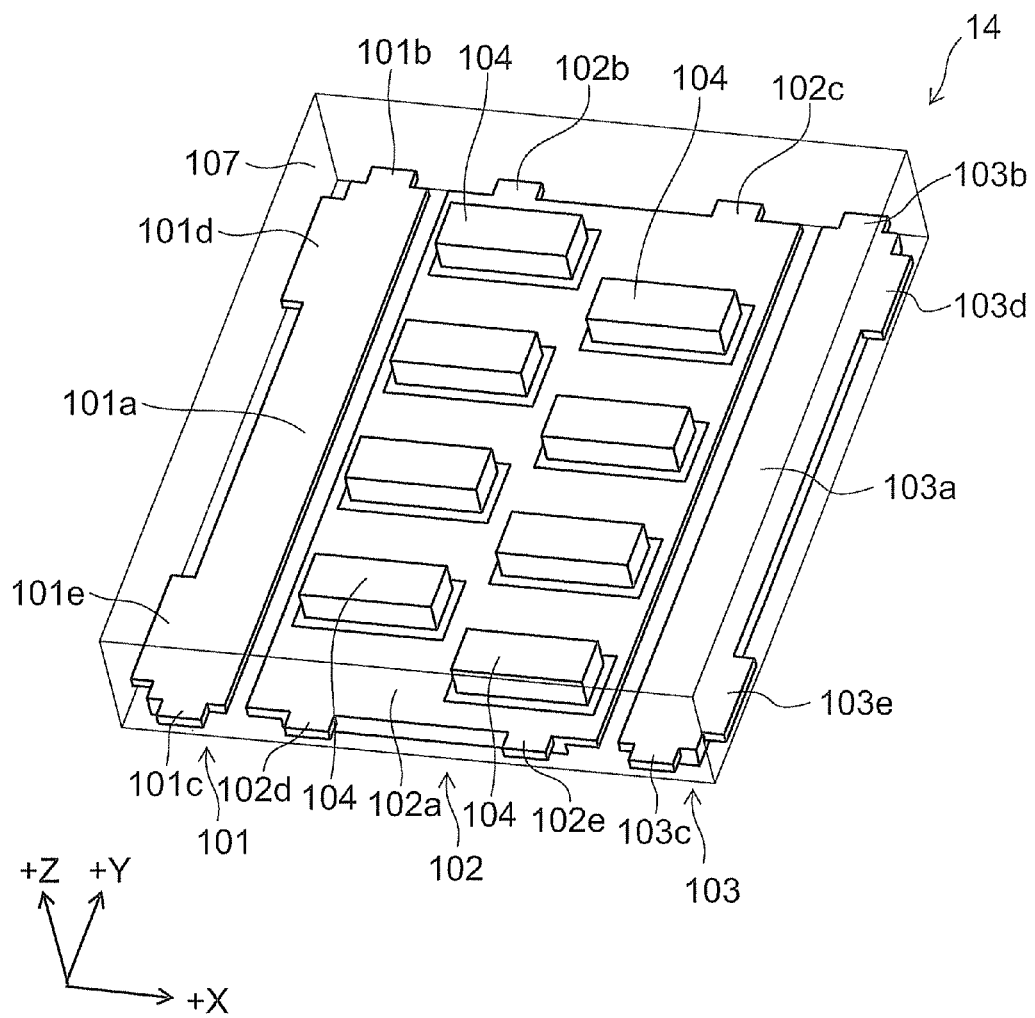
FIG. 5 is a perspective view for illustrating an LED package of the first embodiment.

FIG. 5 is a perspective view for illustrating an LED package of this embodiment.

Figure 6A:
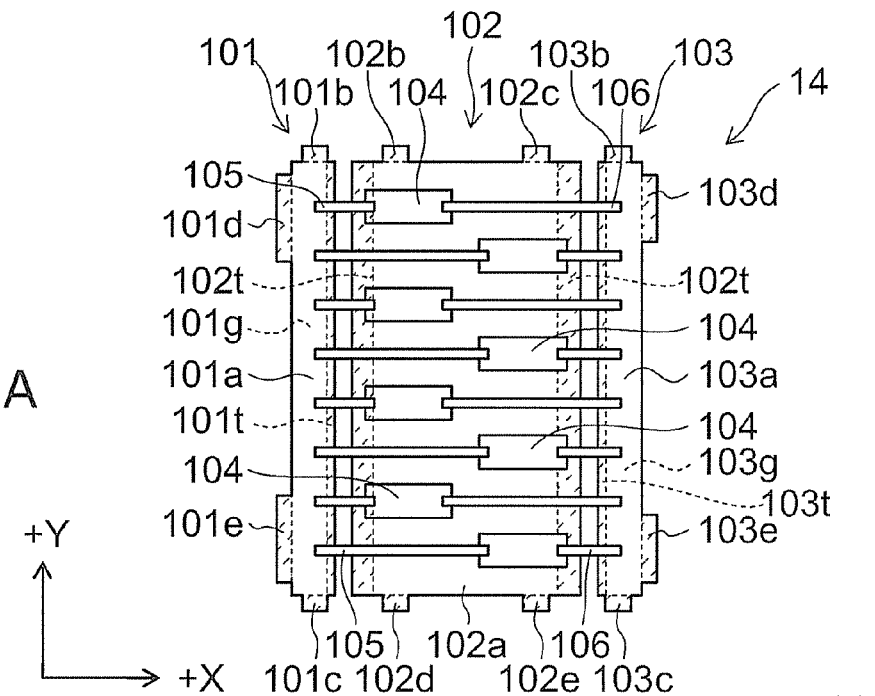
FIG. 6A is a plan view for illustrating lead frames, LED chips, and wires of the LED package of the first embodiment.
Figure 6B:
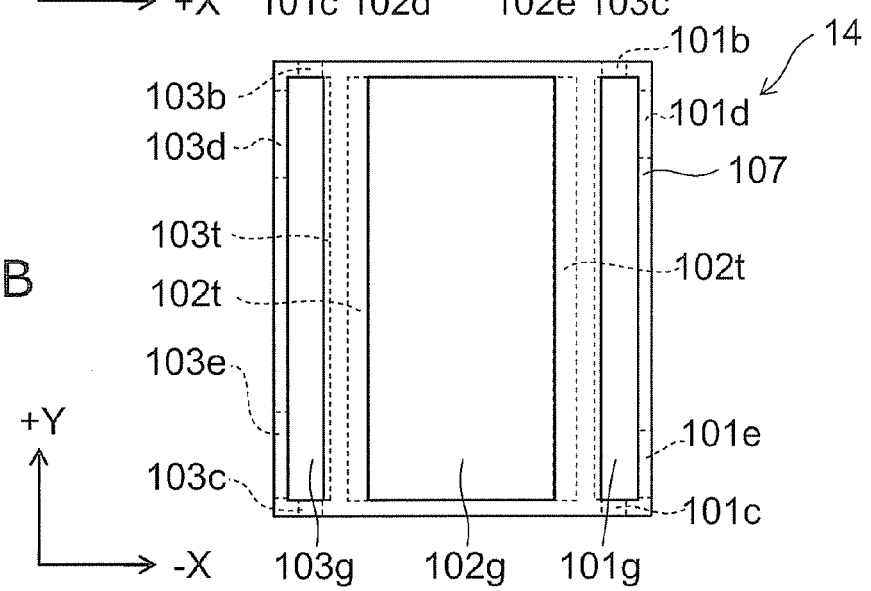
FIG. 6B is a bottom view for illustrating the LED package.
Figure 6C:
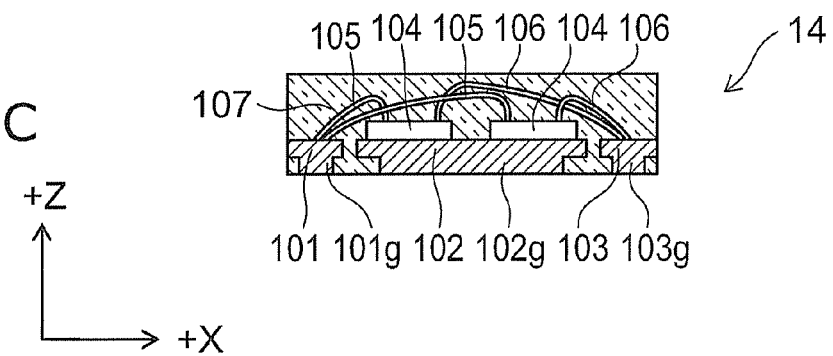
FIG. 6C is a sectional view for illustrating the LED package.

FIG. 6A is a plan view for illustrating lead frames, LED chips, and wires of the LED package of this embodiment. FIG. 6B is a bottom view for illustrating the LED package. FIG. 6C is a sectional view for illustrating the LED package.

Incidentally, the illustration of the wires is omitted in FIG. 5.

As shown in FIG. 1, an LED module 1 according to this embodiment includes a printed board 11. The printed board 11 has a substantially squared planar shape. Two notches 12 are formed in each of two edges 11a and 11b of the LED module 1, the edges 11a and 11b being located opposite to each other. Each of the notches 12 has a semicircular tip. A large portion of an upper surface of the printed board 11 is covered with a reflection film 13.

Hereinafter, in this specification, for convenience of description, a UWZ rectangular coordinate system is introduced. Among two directions parallel to the upper surface of the printed board 11, a direction in which the edges 11a and 11b having the notches 12 formed extend is defined as a U direction. Meanwhile, a direction in which edges 11c and 11d having no notches 12 formed extend is defined as a W direction. Moreover, among directions perpendicular to the upper surface of the printed board 11, a direction in which the reflection film 13 is formed when seen from the printed board 11 is defined as a "+Z direction."

For example, 15 LED packages 14 are mounted in a central region of the upper surface of the printed board 11. Thus, the 15 LED packages 14 are mounted on the LED module 1. The 15 LED packages 14 are disposed in a matrix pattern: five LED packages 14 are aligned in the U direction, and three LED packages 14 are aligned in the W direction. Moreover, for example, 15 Zener diode packages 15 are mounted in a peripheral region of the upper surface of the printed board 11. Specifically, five Zener diode packages 15 are arranged in one row along each of the edges 11b, 11c and 11d of the printed board 11.

As mentioned above, all of the 15 LED packages 14 are disposed in the central region of the printed board 11, but each of the LED packages 14 is disposed apart from the others. The distance between the LED packages 14 is preferably 1 mm or larger, and is preferably equal to or larger than the height of the LED package 14. Meanwhile, the distance between the LED packages 14 is preferably 3 mm or smaller. Moreover, a total area of the LED packages 14 is preferably 15% or less of the area of the printed board 11 when seen from above (+Z direction).

As shown in FIGS. 2 to 4, in the printed board 11, a resin board 21 made of a resin material, for example, glass epoxy is provided. An interconnection 22 is formed on an upper surface of the resin board 21 by, for example, a printing method. The interconnection 22 is formed of, for example, copper (Cu). The interconnection 22 is separated into 26 parts 22a to 22z. The part 22a extends along and in the vicinity of the edge 11a, and a portion thereof extends to the central region of the printed board 11. The parts 22b to 22p are disposed substantially clockwise from the part 22a when seen in the +Z direction. A portion of each of the parts 22b to 22p extends to the central region of the printed board 11, while the other portion thereof is led out to the vicinity of an edge of the printed board 11. The parts 22q to 22z each have a strip shape extending in the W direction and are disposed in the central region of the printed board 11.

An external electrode pad 23a is formed on the part 22a of the interconnection 22, while an external electrode pad 23b is formed on the part 22p. A dummy pad 24 is formed between the external electrode pad 23a and the external electrode pad 23b. Moreover, a test pad 25a is formed on the part 22a, while a test pad 25b is formed on the part 22p. Furthermore, positioning markers 26a, 26b, 26c are formed within the part 22a, a marker 26d is formed in the part 22t, and a marker 26e is formed in the part 22k.

Moreover, one LED package 14 and one Zener diode package 15 are connected in parallel to each other between the part 22a and the part 22b, between the part 22b and the part 22c, between the part 22c and the part 22d, between the part 22d and the part 22e, between the part 22e and the part 22f, between the part 22f and the part 22g, between the part 22g and the part 22h, between the part 22h and the part 22i, between the part 22i and the part 22j, between the part 22j and the part 22k, between the part 22k and the part 22l, between the part 22l and the part 22m between, the part 22m and the part 22n, between the part 22n and the part 22o, and between the part 22o and the part 22p. Thus, as shown in FIG. 3, in the LED module 1, 15 circuits are connected in series between the external electrode pad 23a and the external electrode pad 23b. In each of the circuits, one LED package 14 and one Zener diode package 15 are connected in parallel to each other. A Zener diode chip (unillustrated) is mounted on each of the Zener diode packages 15.

The reflection film 13 is made of a white insulating material, and has a reflectivity of 90% or higher with respect to light having a wavelength of 465 nm. For example, the reflection film 13 is formed of a material in which a filler made of titanium oxide or the like is dispersed in a base material made of an epoxy resin or the like. The reflection film 13 has a thickness of 10 μm or larger, for example, 30 μm or larger. As one example, the reflection film 13 is formed of PSR-4000LEW3 manufactured by TAIYO INK MFG. CO., LTD. The reflection film 13 covers the upper surface of the printed board 11 except for: regions where the LED packages 14 are mounted, regions where the Zener diode packages 15 are mounted, and regions where the external electrode pads 23a and 23b, the dummy pad 24, the test pads 25a and 25b, and the marker 26a to 26e are formed. Thus, the reflection film 13 covers a large portion of the interconnection 22.

Next, the LED packages 14 will be described.

As shown in FIGS. 5 to 6C, three lead frames 101, 102, 103 are provided in the LED package 14 but apart from each other. The lead frames 101 to 103 each have a planar shape, and are disposed on the same plane but apart from each other. The lead frames 101 to 103 are made of the same conductive material. For example, each of the lead frames 101 to 103 includes a copper plate and a silver plated layer formed on an upper surface and a lower surface of the copper plate. Incidentally, no silver plated layer is formed on edge surfaces of the lead frames 101 to 103, and the copper plate is exposed therefrom.

Hereinafter, for convenience of description, an XYZ rectangular coordinate system is introduced for the LED package, besides the aforementioned UWZ rectangular coordinate system. Among directions parallel to upper surfaces of the lead frames 101 to 103, a direction from the lead frame 101 to the lead frame 102 is defined as a +X direction. Among directions perpendicular to the upper surfaces of the lead frames 101 to 103, an upward direction, i.e., a direction in which an LED chip to be described later is mounted on the lead frames when seen therefrom, is defined as a +Z direction. One of directions which intersect both the +X direction and the +Z direction is defined as a +Y direction. Note that directions opposite to the +X direction, the +Y direction, and the +Z direction are respectively defined as a −X direction, a −Y direction and −Z direction. Meanwhile, for example, the "+X direction" and the "−X direction" may be collectively referred to as simply an "X direction." In this embodiment, the +X direction coincides with the aforementioned +U direction; the +Y direction coincides with the +W direction; and the +Z directions are common in the XYZ coordinate system and the UWZ coordinate system. However, the +X direction does not always have to coincide with the +U direction, and the +Y direction does not always have to coincide with the +W direction.

The lead frame 101 includes a strip-shaped base portion 101a that has a longitudinal direction thereof along a Y direction. From the base portion 101a, a extending portion 101b extends in the +Y direction, a extending portion 101c extends in the −Y direction, and two extending portions 101d and 101e extend in the −X direction. The lead frame 102 includes a strip-shaped base portion 102a that has a longitudinal direction thereof along the Y direction. From the base portion 102a, two extending portions 102b and 102c extend in the +Y direction, and two extending portions 102d and 102e extend in the −Y direction. The lead frame 103 has a shape substantially equal to an inverted shape of the lead frame 101 in the X direction.

Projected portions 101g to 103g are formed in regions, except for end portions on the X direction sides, of lower surfaces of the base portions 101a to 103a of the lead frames 101 to 103. Portions of the base portions 101a to 103a where the projected portions 101g to 103g are not formed are thin plate portions 101t to 103t. The projected portions are formed in regions of the respective lead frames, the regions being apart from edges of the corresponding lead frames, the edges facing each other. Regions including these edges are the thin plate portions. In this manner, each of the lead frames 101 to 103 has two levels of thickness. The regions where the projected portions 101g to 103g are formed are relatively thick, while other regions, i.e., the thin plate portions and the extending portions, are relatively thin. An upper surface of each lead frame is on the same plane as those of the others. A lower surface of the projected portion of each lead frame is on the same plane as those of the others. The positions of the upper surfaces of the extending portions in a Z direction coincide with the positions of the upper surfaces of the lead frames. Thus, the extending portions are disposed on the same XY plane.

The LED package 14 includes multiple, for example, eight LED chips 104. Each of the LED chips 104 has a sapphire substrate and a semiconductor layer made of gallium nitride (GaN) or the like stacked on a sapphire substrate, for example. The LED chip 104 has a rectangular parallelepiped shape, for example, and has two terminals provided on an upper surface thereof. The LED chip 104 emits blue light, for example, when a voltage is supplied between the terminals.

All of the eight LED chips 104 are mounted above the lead frame 102 with die mounting material (unillustrated) interposed therebetween. One terminal of each of the LED chips 104 is connected to the lead frame 101 through a wire 105, while the other terminal is connected to the lead frame 103 through a wire 106. The wires 105 and 106 are formed of a metal, for example, gold or aluminium. The eight LED chips 104 are arranged in a manner that two LED chips are aligned in the X direction, and four LED chips are aligned in the Y direction. The LED chips 104 are arranged not in a matrix pattern but in a zigzag alignment. Specifically, the phase of arranging a row of the four LED chips 104 disposed on the +X direction side and aligned along the Y direction is shifted by a half cycle from the phase of arranging a row of the four LED chips 104 disposed on the −X direction side and aligned along the Y direction. In this manner, 15 LED packages 14 are mounted on one LED module 1, and eight LED chips 104 are provided in each of the LED packages 14. Specifically, groups each consisting of eight LED chips 104, thus 120 (=15×8) LED chips 104 in total, are mounted on one LED module 1. Thus, the LED module 1 has a hierarchical structure: "LED module 1, LED packages 14, LED chips 104."

Furthermore, the LED package 14 includes a transparent resin body 107. The transparent resin body 107 is formed of a transparent resin, for example, a silicone resin. Note that the term "transparent" includes meaning of translucent, also. The transparent resin body 107 has an appearance of rectangular parallelepiped, and covers the lead frames 101 to 103, the die mounting material, the LED chips 104, and the wires 105 and 106. The appearance of the transparent resin body 107 is the appearance of the LED package 14. Lower surfaces of the projected portions 101g to 103g of the lead frames 101 to 103 are exposed on a lower surface of the transparent resin body 107. In contrast, lower surfaces of the thin plate portions 101t to 103t of the lead frames 101 to 103 are covered with the transparent resin body 107. Specifically, portions of the lower surfaces and portions of the edge surfaces of the lead frames are exposed on the lower surface and side surfaces of the transparent resin body 107. In this manner, the transparent resin body 107 has a rectangular shape when seen from above, and tip edge surfaces of the aforementioned multiple extending portions are each exposed on a corresponding one of the three different side surfaces of the transparent resin body 107. Note that in this specification, the term "cover" is a concept including both a case where one that covers is in contact with one that is covered and a case where the two are not in contact with each other. Meanwhile, in FIG. 6A, the relatively thin portions of the lead frames 101 to 103, i.e., the thin plate portions and the extending portions, are indicated by hatch with broken lines.

Multiple phosphors are dispersed in the transparent resin body 107. Each of the phosphors is particulate, which absorbs light emitted from the LED chip 104 and emits light having a longer wavelength than the absorbed light. For example, the phosphor absorbs part of blue light emitted from the LED chip 104 and emits yellow light. Thereby, blue light emitted by the LED chip 104 but not absorbed by the phosphor and yellow light emitted from the phosphor are emitted from the LED package 14. Hence, emission light from the LED package 14 becomes white as a whole.

As such phosphors, for example, a silicate-based phosphor which emits yellow-green, yellow, or orange light can be used. The silicate-based phosphor can be represented by the following general formula.

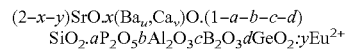
$SiO_2.aP_2O_5bAl_2O_3cB_2O_3dGeO_2:yEu^{2+}$

Here, 0<x, 0.005<y<0.5, x+y≦1.6, 0≦a, b, c, d<0.5, 0<u, 0<v, and u+v=1.

As the yellow phosphor, a YAG-based phosphor can also be used. The YAG-based phosphor can be represented by the following general formula.

Here, 0≦x<1, 0≦y≦1, and RE is at least one element selected from Y and Gd.

As the phosphors, sialon-based red and green phosphors can also be mixed for use. Specifically, the phosphors can be a green phosphor which absorbs blue light emitted from the LED chip 104 and emits green light, and a red phosphor which absorbs blue light and emits red light.

The sialon-based red phosphor can be represented by the following general formula, for example.

Here, M is at least one metal element except for Si and Al, and is particularly desirably at least one of Ca and Sr. R is a luminescent center element, and is particularly desirably Eu. Additionally, x, a1, b1, c1, and d1 satisfy $0<x\leqq1$, $0.6<a1<0.95$, $2<b1<3.9$, $0.25<c1<0.45$, and $4<d1<5.7$.

A specific example of such a sialon-based red phosphor is represented below.

$$Sr_2Si_7Al_7ON_{13}:Eu^{2+}$$

The sialon-based green phosphor can be represented by the following general formula, for example.

$$(M_{1-x},R_x)_{a2}AlSi_{b2}O_{c2}N_{d2}$$

Here, M is at least one metal element except for Si and Al, and is particularly desirably at least one of Ca and Sr. R is a luminescent center element, and is particularly desirably Eu. Additionally, x, a2, b2, c2, and d2 satisfy $0<x\leqq1$, $0.93<a2<1.3$, $4.0<b2<5.8$, $0.6<c2<1$, and $6<d2<11$.

A specific example of such a sialon-based green phosphor is represented below.

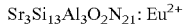

$$Sr_3Si_{13}Al_3O_2N_{21}:Eu^{2+}$$

Next, a method for manufacturing an LED module according to this embodiment will be described.

The manufacturing process for an LED module according to this embodiment includes separate processes: a process for manufacturing an LED package and a process for mounting the LED package on a printed board.

Figure 7:
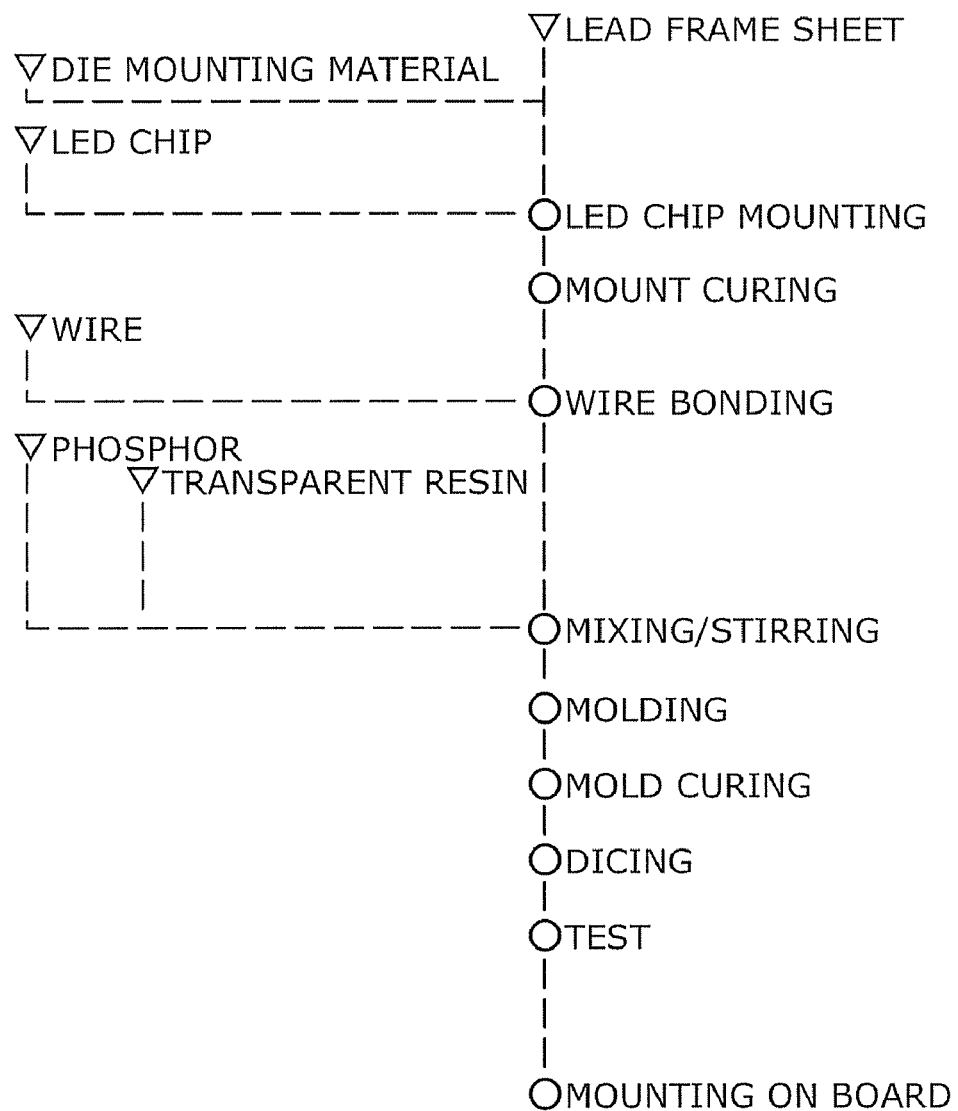
FIG. 7 is a flowchart illustrating a method for manufacturing an LED package according to the first embodiment.

FIG. 7 is a flowchart for illustrating the method for manufacturing an LED package according to this embodiment.

FIGS. 8A to 10B are process sectional views for illustrating the method for manufacturing an LED package according to this embodiment.

Figure 11A:
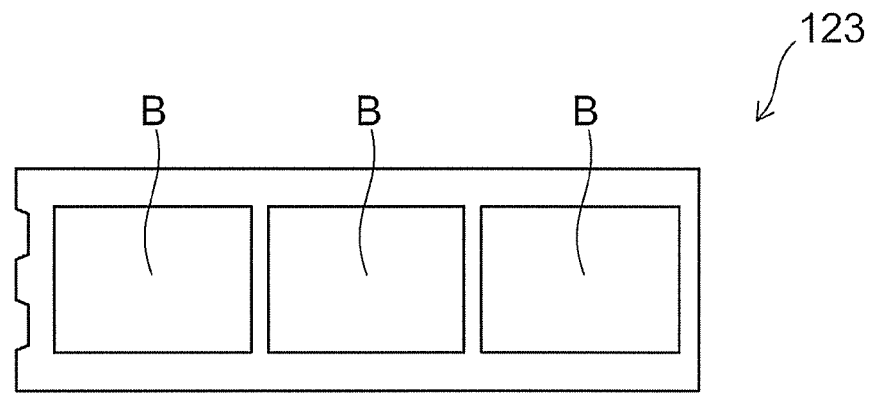
FIG. 11A is a plan view illustrating a lead frame sheet in the first embodiment.
Figure 11B:
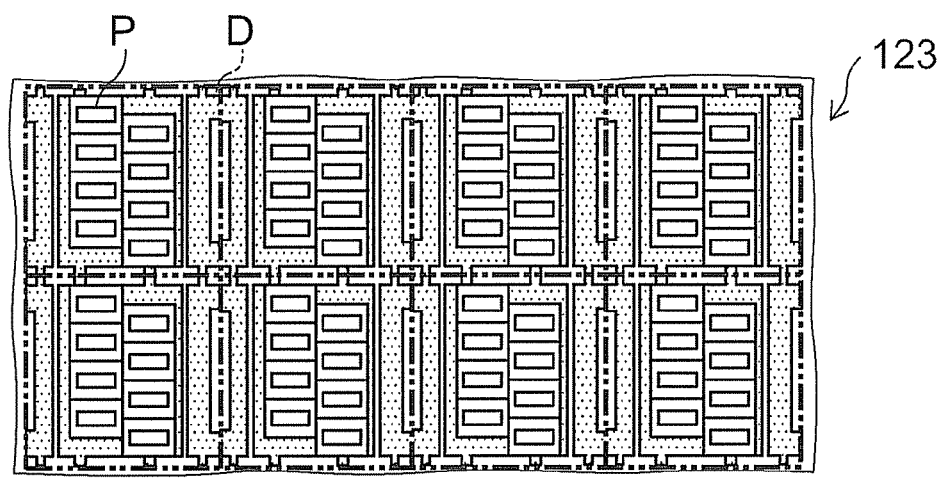
FIG. 11B is a partially enlarged plan view illustrating element regions of this lead frame sheet.

FIG. 11A is a plan view for illustrating a lead frame sheet in this embodiment. FIG. 11B is a partially enlarged plan view for illustrating element regions of the lead frame sheet.

Figure 8A:
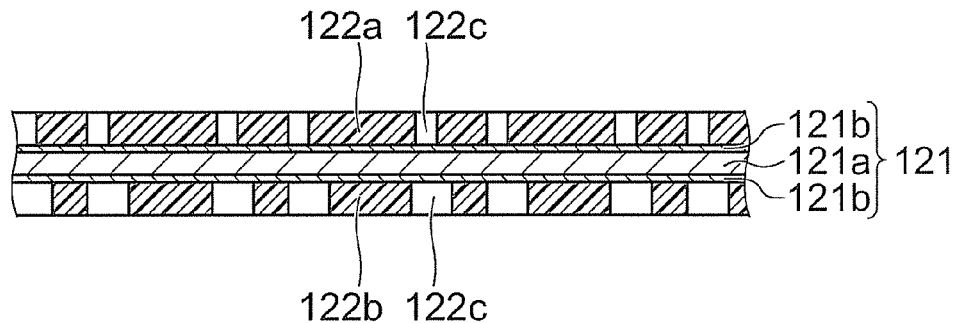
FIGS. 8A to 10B are process sectional views illustrating a method for manufacturing an LED package according to the first embodiment.

First, as shown in FIG. 8A, a conductive sheet 121 made of a metal material is prepared. The conductive sheet 121 includes, for example, a strip-shaped copper plate 121a and silver plated layers 121b formed on upper and lower surfaces of the copper plate 121a. Next, masks 122a and 122b are formed respectively on the upper and lower surfaces of the conductive sheet 121. Openings 122c are selectively formed in the masks 122a and 122b. The masks 122a and 122b can be formed by a printing method, for example.

Next, the conductive sheet 121 to which the masks 122a and 122b are attached is immersed in an etchant, and the conductive sheet 121 is wet-etched. Thereby, portions, of the conductive sheet 121, locating inside the openings 122c are selectively removed by etching. In this event, for example, by adjusting the immersion time, the etching amount is controlled, so that the etching is stopped before the conductive sheet 121 is penetrated by sole etching from either the upper surface side or the lower surface side of the conductive sheet 121. In this manner, half-etching is performed from the upper and lower surface sides. However, portions, of the conductive sheet 121, etched from both the upper surface side and the lower surface side are penetrated. After that, the masks 122a and 122b are removed.

Figure 8B:
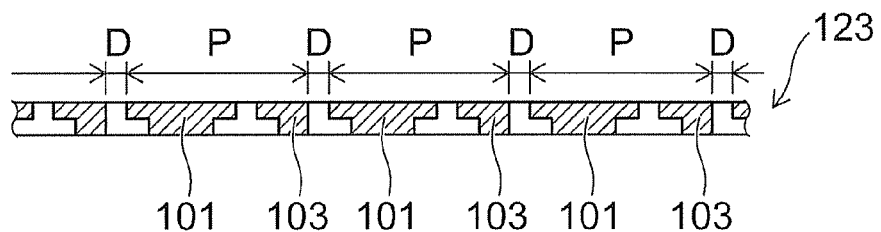

Thus, as shown in FIGS. 7 and 8B, the copper plate 121a and the silver plated layers 121b are selectively removed from the conductive sheet 121, and a lead frame sheet 123 is formed. Incidentally, for convenience of illustration, in FIG. 8B and the subsequent drawings, the copper plate 121a and the silver plated layer 121b are not distinguished from each other, and integrally illustrated as the lead frame sheet 123. The configuration of the lead frame and the like is illustrated simply.

For example, three blocks B are set in the lead frame sheet 123 as shown in FIG. 11A. In each of the blocks B, for example, approximately 1000 element regions P are set. As shown in FIG. 11B, the element regions P are arranged in a matrix pattern, and a dicing region D is formed in a lattice pattern among the element regions P. In each of the element regions P, a basic pattern including lead frames which are apart from each other is formed. The metal material forming the conductive sheet 121 is left remained in the dicing region D in such a way as to connect the adjacent element regions P to each other.

Specifically, although the lead frame 101 to the lead frame 103 are apart from one another in the element region P, a lead frame 101 belonging to a certain element region P is connected to a lead frame 103 belonging to an element region P adjacent to the certain element region P in the -X direction when seen therefrom. Between the two frames, a projected opening is formed. Moreover, lead frames 101 respectively belonging to element regions P adjacent to each other in the Y direction are connected through a bridge. Lead frames 102 respectively belonging to element regions P adjacent to each other in the Y direction are connected through a bridge. Similarly, lead frames 103 respectively belonging to element regions P adjacent to each other in the Y direction are connected through a bridge. Thus, four conductive members extend in three directions from each of base portions 101a and 103a of the lead frames 101 and 103. Furthermore, by performing half-etching when the lead frame sheet 123 is etched from a lower surface side thereof, projected portions 101g to 103g are formed respectively on lower surfaces of the lead frames 101 to 103 (see FIGS. 6A, 6B and 6C).

Figure 8C:
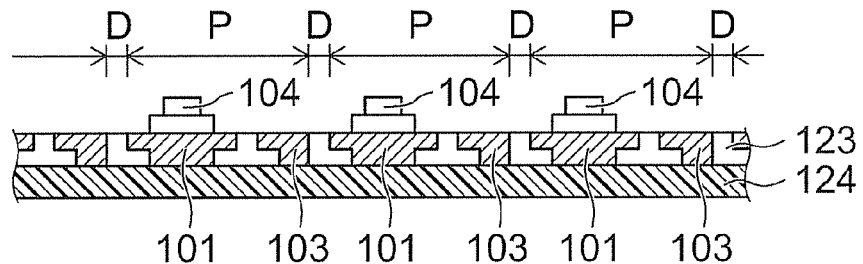

Next, as shown in FIGS. 7 and 8C, a reinforcement tape 124 made of, for example, a polyimide is pasted on the lower surface of the lead frame sheet 123. Then, a die mounting member is attached onto each of the lead frames 102 belonging to the element regions P of the lead frame sheet 123. For example, a pasty die mounting member is ejected onto the lead frame 102 from an ejector, or transferred onto the lead frame 102 in a mechanical way. Next, an LED chip 104 is mounted on the die mounting member. Next, a thermal treatment for sintering the die mounting member is performed (mount cure). Thus, in each of the element regions P of the lead frame sheet 123, the LED chip 104 is mounted above the lead frame 102 with the die mounting member interposed therebetween.

Figure 8D:
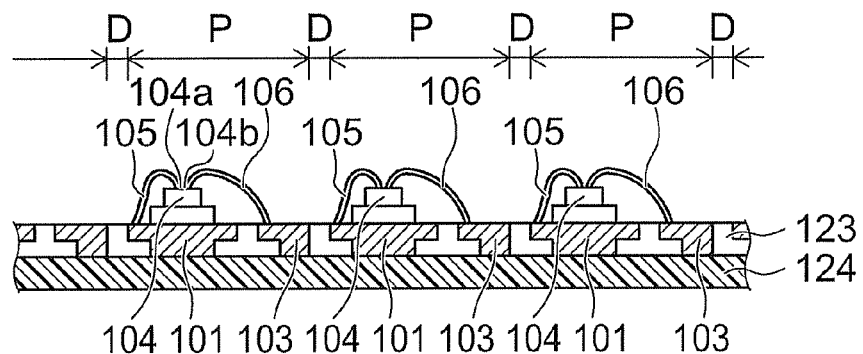

Next, as shown in FIGS. 7 and 8D, by ultrasonic bonding, for example, one end of a wire 105 is bonded to a terminal 104a of the LED chip 104, and the other end of the wire 105 is bonded to an upper surface of the lead frame 101. Moreover, one end of a wire 106 is bonded to a terminal 104b of the LED chip 104, and the other end of the wire 106 is bonded to an upper surface of the lead frame 103. Thus, the terminal 104a is connected to the lead frame 101 through the wire 105, and the terminal 104b is connected to the lead frame 103 through the wire 106.

Figure 9A:
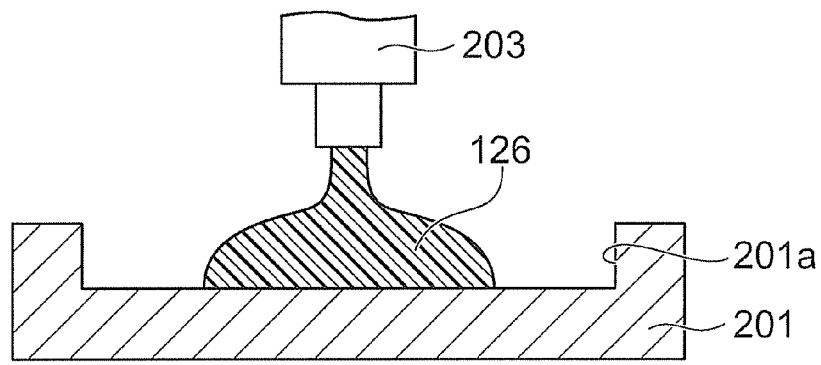

Next, as shown in FIGS. 7 and 9A, a lower mold 201 is prepared. The lower mold 201 and an upper mold 202 described below form a set of molds. In an upper surface of the lower mold 201, a rectangular parallelepiped-shaped recessed portion 201a is formed. Meanwhile, a transparent resin material such as a silicone resin is mixed with phosphors and stirred to prepare a liquid or semi-liquid phosphor-containing resin material 126. The phosphor-containing resin material 126 is supplied into the recessed portion 201a of the lower mold 201 with a dispenser 203.

Figure 9B:
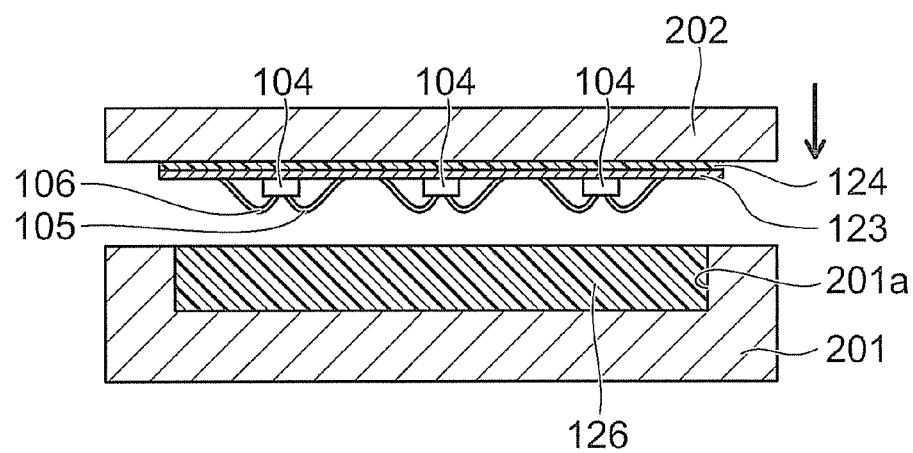

Next, as shown in FIGS. 7 and 9B, the aforementioned lead frame sheet 123 on which the LED chips 104 are mounted is attached on a lower surface of the upper mold 202 in a way that the LED chips 104 face downward. Then, the upper mold 202 is pressed against the lower mold 201, and the molds are clamped. Thereby, the lead frame sheet 123 is pressed against the phosphor-containing resin material 126. In this event, the phosphor-containing resin material 126 covers the LED chips 104, the wires 105 and 106, and enters portions, of the lead frame sheet 123, removed by the etching. In this manner, the phosphor-containing resin material 126 is molded. It is preferable that the mold process is performed in a vacuum atmosphere. This prevents bubbles generated in the phosphor-containing resin material 126 from adhering to portions half-etched in the lead frame sheet 123.

Figure 9C:
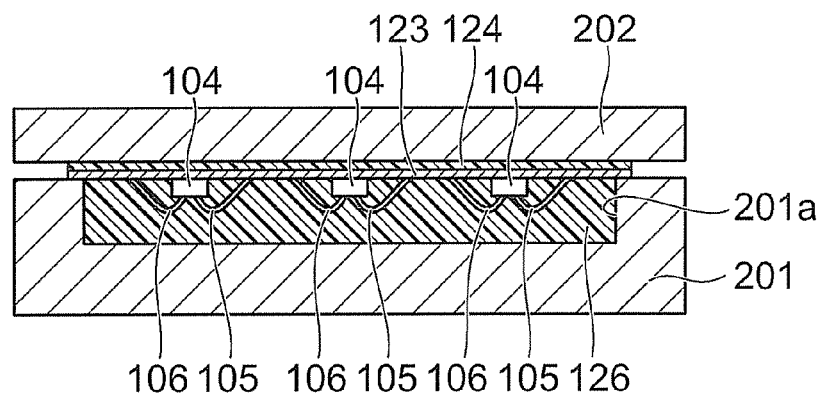
Figure 10A:
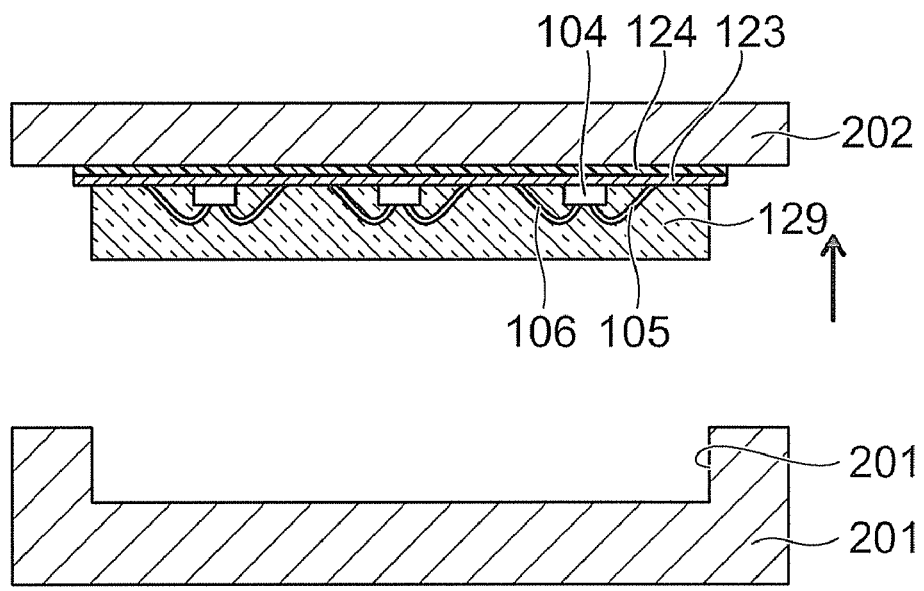

Next, as shown in FIGS. 7 and 9C, with an upper surface of the lead frame sheet 123 being pressed against the phosphor-containing resin material 126, a thermal treatment (mold cure) is performed to cure the phosphor-containing resin material 126. Then, the upper mold 202 is separated from the lower mold 201 as shown in FIG. 10A. Thus, a transparent resin plate 129 is formed on the lead frame sheet 123. The transparent resin plate 129 covers the entire upper surface and a portion of the lower surface of the lead frame sheet 123, and the LED chips 104 and so forth are buried therein. In the transparent resin plate 129, the phosphors are dispersed. Subsequently, the reinforcement tape 124 is peeled from the lead frame sheet 123. Thereby, the lower surfaces of the projected portions 101g to 103g of the lead frames 101 to 103 (See FIGS. 6A, 6B and 6C) are exposed on the surface of the transparent resin plate 129.

Figure 10B:
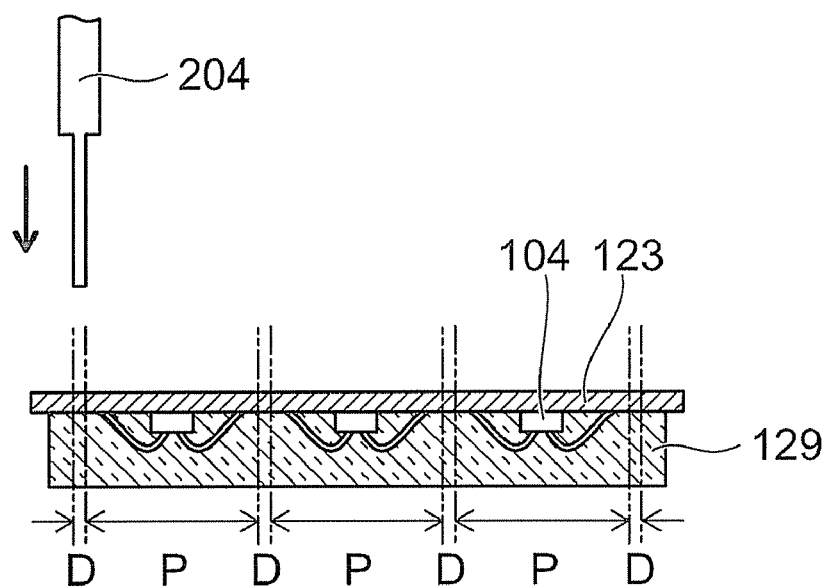

Next, as shown in FIGS. 7 and 10B, with a blade 204, an assembly of the lead frame sheet 123 and the transparent resin plate 129 is diced from a side of the lead frame sheet 123. Specifically, the dicing is performed from the −Z direction side toward the +Z direction. Thereby, portions, of the lead frame sheet 123 and the transparent resin plate 129, disposed in the dicing region D are removed. As a result, portions, of the lead frame sheet 123 and the transparent resin plate 129, disposed in the element regions P are segmented, and thus LED packages 14 shown in FIGS. 5 to 6C are manufactured. Incidentally, the assembly of the lead frame sheet 123 and the transparent resin plate 129 may be diced from a side of the transparent resin body 129.

In each of the LED packages 14 after dicing, the lead frames 101 to 103 are separated from the lead frame sheet 123. Moreover, the transparent resin plate 129 is parted to form transparent resin bodies 107. Furthermore, portions, of the dicing region D, extending in the Y direction pass through the openings of the lead frame sheet 123, and extending portions 101d, 101e, 103d, 103e are formed in the lead frames 101 and 103. In addition, each of the bridges is parted, and extending portions 101b and 101c are formed in the lead frame 101, and extending portions 102b, 102c, 102d and 102e are formed in the lead frame 102, and extending portions 103b and 103c are formed in the lead frame 103. Tip edge surface of each extending portions is exposed on side surfaces of the transparent resin body 107.

Next, as shown in FIG. 7, various tests are performed on the LED package 14. In this event, tip edge surfaces of the extending portions 101b to 101e and 103b to 103e can be used as test terminals. By the process described so far, the LED package 14 is formed.

Then, 15 LED packages 14 manufactured in this manner are mounted on a printed board 11. In this event, lead frames 101 and 103 of each of the LED packages 14 are bonded to corresponding adjacent two parts among parts 22a to 22p of an interconnection 22. Moreover, a lead frame 102 of each LED package 14 is bonded to a corresponding one of parts 22q to 22z of the interconnection 22. Thereby, the lead frames 101 and 103 are connected to an external electrode pad 23a or 23b. Meanwhile, the lead frame 102 is not connected to the external electrode pads 23a and 23b, and is in the state of floating. Next, 15 Zener diode packages 15 are mounted on the printed board 11. In this event, each of the Zener diode packages 15 is bonded to corresponding adjacent two parts among the parts 22a to 22p of the interconnection 22. Thus, an LED module 1 is manufactured.

Next, effects and advantages of this embodiment will be described.

In the LED module 1 according to this embodiment, eight LED chips 104 are put as a group in one LED package 14, and 15 of such LED packages 14 are mounted on one LED module 1. In this manner, the LED module is configured to have a hierarchical structure. Accordingly, the yield of the LED module is improved. Specifically, in the case where all the LED chips are directly mounted on the printed board, if one of the LED chips becomes defective after the LED chips are mounted, the entire LED module may become defective. However, in this embodiment, by replacing the LED package including such a defective LED chip with a nondefective product, a nondefective LED module is manufactured. Particularly, in this embodiment, inspection is performed on each LED package when the LED packages are manufactured. Accordingly, an LED module is assembled only selecting nondefective LED package. As a result, an LED module is manufactured at a low cost.

Moreover, in this embodiment, the LED packages are disposed mainly in the central region of the printed board. Accordingly, the emission region of the LED module is narrowed. Thus, the emission region can be used as a point light source. Moreover, when the LED module is incorporated into a light source device, an optical system of the light source device is easily designed. For example, when a light bulb is manufactured using an LED module according to this embodiment, portions of the light bulb other than the LED module can be designed in the same manner as that of a conventional light bulb using a filament.

To increase such effects, the LED packages are preferably disposed to be closest possible to one another. However, when the LED packages come into contact with each other, the temperature of the LED packages tends to increase as the LED packages are driven, consequently deteriorating the light emission efficiency of the LED chips. For this reason, it is preferable that the LED packages should not be in contact with each other. If the distance between the LED packages is 1 mm or larger, the overheating of the LED packages is effectively suppressed. Moreover, if the distance between the LED packages is equal to or larger than the height of the LED package, the width of a gap between the LED packages becomes equal to or wider than the depth of this gap; thus, air efficiently flows in the gap. Thereby, the LED packages are efficiently cooled. Furthermore, if a total area of the LED packages 14 is 15% or less of the area of the printed board 11 when seen from above (+Z direction), the heat dissipation properties becomes favorable, and the overheating of the LED packages is effectively suppressed. Meanwhile, even if the distance between the LED packages is increased to be larger than 3 mm, the effect of suppressing the overheating of the LED packages is no longer increased. For this reason, the distance between the LED packages is preferably 3 mm or smaller.

Furthermore, the LED module according to this embodiment includes the Zener diode packages 15. Thus, it is not necessary to provide a Zener diode chip in each of the LED packages 14, and thereby the LED packages 14 can be miniaturized. As a result, the LED packages 14 are disposed mainly in a small region to successfully narrow the emission region of the LED module.

Still furthermore, in this embodiment, the reflection film 13 is provided on the printed board 11, and accordingly the light utilization efficiency is high. When the reflectivity of the reflection film 13 is 90% or higher, the effect is particularly noticeable. Moreover, the thickness of the reflection film 13 is preferably 20 μm or larger. This thickness no longer causes the lower layer to influence the reflectivity of the reflection film 13 because visible light hardly passes through the reflection film 13. Note that, when the variation of the thickness of the reflection film 13 is taken into consideration, the thickness of the reflection film 13 is more preferably 30 μm or larger.

Next, effects and advantages attributable to the configuration of the LED packages in this embodiment will be described.

Furthermore, in the LED package 14 of this embodiment, no enclosure made of a white resin is provided. Accordingly, no enclosure is degraded by absorbing light and heat generated from the LED chip. Particularly, when an enclosure is formed of a thermoplastic polyamide resin, the resin is likely to be degraded. In this embodiment, however, there is no risk of such degradation. For this reason, the LED package 14 of this embodiment has a high durability. Thus, the LED package 14 of this embodiment has a long life and a high reliability, and is applicable in wide usage.

Moreover, in this embodiment, the transparent resin body of the LED package is formed of a silicone resin. Since a silicone resin has a high durability for light and heat, the durability of the LED module is improved by this resin, also.

Still furthermore, in this embodiment, the transparent resin body of the LED package covers portions of the lower surfaces and large portions of the edge surfaces of the lead frames, and holds peripheral portions of the lead frames. In this manner, the lower surfaces of the projected portions of the lead frames are exposed on the transparent resin body, and external electrode pads are formed; moreover, the holdability for the lead frames is increased. Specifically, by forming the projected portions on the central portions of the base portions, indentations are formed on part of the base portions. The transparent resin body goes around and into the indentations to strongly hold the lead frames. This makes the lead frames hardly detached from the transparent resin body and the yield of the LED package is improved. Moreover, this can prevent that lead frames 101 and 102 detach from the transparent resin body 107 by temperature stress in using the LED module 1.

Still furthermore, in this embodiment, the silver plated layers are formed on the upper and lower surfaces of the lead frames. Since silver plated layers have a high light reflectivity, the LED package according to this embodiment has a high light extraction efficiency.

Still furthermore, in this embodiment, from the single conductive sheet, a large number, for example, approximately several thousands, of the LED packages can be manufactured at once. Thus, the manufacturing cost per LED package is reduced. In addition, since no enclosure is provided, the numbers of components and processes are small, and the cost is low.

Still furthermore, in this embodiment, the lead frame sheet is formed by wet-etching. For this reason, when an LED package of novel layout is manufactured, only the original plates of the masks need to be prepared. The initial cost is suppressed to a lower extent than a case where a lead frame sheet is formed by a method such as pressing with a mold.

Still furthermore, in this embodiment, the extending portions are extended from the base portions of the lead frames. Thus, the base portions themselves are prevented from being exposed on the side surfaces of the transparent resin body, and the exposed areas of the lead frames are reduced. Moreover, the contact area between the lead frames and the transparent resin body can be made to increase. As a result, the lead frames are prevented from being detached from the transparent resin body. Moreover, corrosion of the lead frames is also suppressed.

The effects will be considered from the viewpoint of the manufacturing method. The openings and the bridges are provided in the lead frame sheet 123 in a way that the openings and the bridges exist within the dicing region D as shown in FIG. 11B. Thereby, the amount of metal portion within the dicing region D is reduced. Thus, dicing is performed easily, and wearing of the dicing blade is suppressed. Moreover, in this embodiment, from each of the lead frames 102, four extending portions are extended. Thus, in the process of mounting the LED chip 14 shown in FIG. 8C, a lead frame 102 is surely supported in three directions by lead frames 102 in adjacent element regions P, and the mountability is high. Moreover, in this embodiment, four extending portions are extended in three directions from each of the lead frames 101 and 103. Thus, in the wire bonding process shown in FIG. 8D, bonding positions of the wires are surely supported in the three directions. Accordingly, the ultrasound applied in the ultrasonic bonding scarcely escapes, and the wires are favorably bonded to the lead frames and the LED chip.

Still furthermore, in the dicing process shown in FIG. 10B of this embodiment, the dicing is performed from the lead frame sheet 123 side. Thereby, the metal material forming the end portions of the lead frames 11 and 12 subjected to cutting stretches in the +Z direction on the side surface of the transparent resin body 17. For this reason, this metal material never stretches in the −Z direction on the side surface of the transparent resin body 17, nor protrudes from the lower surface of the LED package 14; hence, no burr is formed. Thus, when the LED package 14 is mounted on the printed board 11, mounting failure due to a burr never happens.

Still furthermore, in this embodiment, the lead frames 101 and 103 functions as external electrodes when a potential is applied from the outside. Meanwhile, no potential needs to be applied to the lead frame 102. The lead frame 102 can be used as a lead frame dedicated to a heat sink. Moreover, when the LED packages 14 are mounted on the printed board 11, a so-called Manhattan phenomenon can be suppressed by bonding solder balls to each of the lead frames 101, 102, 103. The Manhattan phenomenon refers to a phenomenon that when a device or the like is mounted on a board with multiple solder balls or the like interposed therebetween, the device stands up due to different melting timing of the solder balls in a reflow furnace and the surface tension of the solder. This phenomenon causes mounting failure. In this embodiment, the lead frame layout is symmetrical with respect to the X direction, and the solder balls are densely disposed in the X direction; thereby, the Manhattan phenomenon is less likely to occur.

Still furthermore, according to this embodiment, the multiple LED chips are mounted on one LED package, and a larger amount of light is obtained. Moreover, the LED chips are arranged in a zigzag alignment. Accordingly, the LED package is miniaturized with the shortest distance between the LED chips being kept at a certain value or more. By setting the shortest distance between the LED chips at a certain value or more, light emitted from a certain LED chip is more likely to be absorbed by the phosphors before the light reaches an adjacent LED chip. This improves the light extraction efficiency. Additionally, heat radiated from a certain LED chip is less likely to be absorbed by an adjacent LED chip. Accordingly, the deterioration of the light emission efficiency due to the increase in temperature of the LED chip is suppressed.

Second to fifth embodiments described below are examples of configuration of the printed board modified from that in the above-described first embodiment.

First, the second embodiment will be described.

Figure 12:
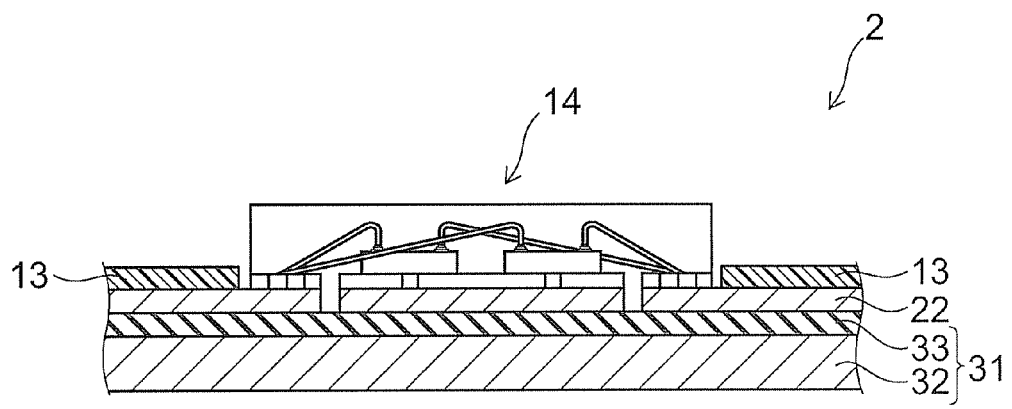
FIG. 12 is a sectional view illustrating an LED module according to a second embodiment.

FIG. 12 is a sectional view for illustrating an LED module according to this embodiment.

As shown in FIG. 12, an LED module 2 according to this embodiment is different from the above-described LED module 1 according to the first embodiment (see FIG. 4) in that a multi-layer board 31 is provided instead of the resin board 21 (see FIG. 4). The multi-layer board 31 includes a metal base layer 32 made of a metal, and an insulating layer 33 made of a resin material and provided on the metal base layer 32. The metal base layer 32 is made of, for example, copper (Cu) or aluminium (Al), and has a thickness of, for example, 0.5 to 1.0 mm. The insulating layer 33 is made of, for example, an epoxy resin, and has a thickness of, for example, 0.1 mm.

In this embodiment, by providing the metal base layer 32 in the printed board, the heat dissipation properties of the LED module are improved. Moreover, by providing the thin insulating layer 33 on the metal base layer 32, the insulation among the parts 22*a* to 22*z* (see FIG. 2) of the interconnection 22 is guaranteed. Configuration, manufacturing method, effects, and advantages, other than the above, of this embodiment are the same as those of the above-described first embodiment.

Next, the third embodiment will be described.

Figure 13:
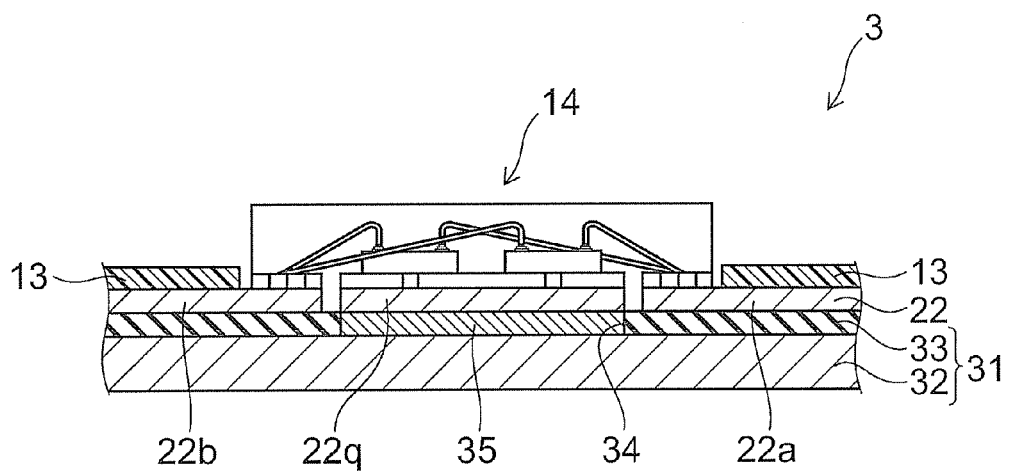
FIG. 13 is a sectional view illustrating an LED module according to a third embodiment.

FIG. 13 is a sectional view for illustrating an LED module according to this embodiment.

As shown in FIG. 13, an LED module 3 according to this embodiment is different from the above-described LED module 2 according to the second embodiment (see FIG. 12) in that a penetration hole 34 is formed in the insulating layer 33 of the printed board, and that a penetration metal layer 35 is formed in the penetration hole 34. The penetration metal layer 35 penetrates the insulating layer 33 in a thickness direction thereof. The penetration metal layer 35 has an upper surface in contact with the parts 22*q* to 22*z* of the interconnection 22, and a lower surface in contact with the metal base layer 32. The penetration hole 34 is formable by laser processing from the upper surface side of the multi-layer board 31, for example. The penetration metal layer 35 is formable by burying a copper plated layer in the penetration hole 34, removing the copper plated layer from the top of the insulating layer 33 so that the copper plated layer may remain only in the penetration hole 34.

According to this embodiment, in each of the 15 LED packages 14, the lead frame 102 on which the LED chips 104 are mounted is connected in common to the metal base layer through any one of the parts 22*q* to 22*z* of the interconnection 22 and the penetration metal layer 35. Thus, the metal base layer 32 can be used as the common heat sink, and the heat dissipation properties are further improved. Incidentally, a ground potential may be applied to the metal base layer 32, or the metal base layer 32 may be in the state of floating. Configuration, manufacturing method, effects, and advantages, other than the above, of this embodiment are the same as those of the above-described second embodiment.

Next, the fourth embodiment will be described.

Figure 14:
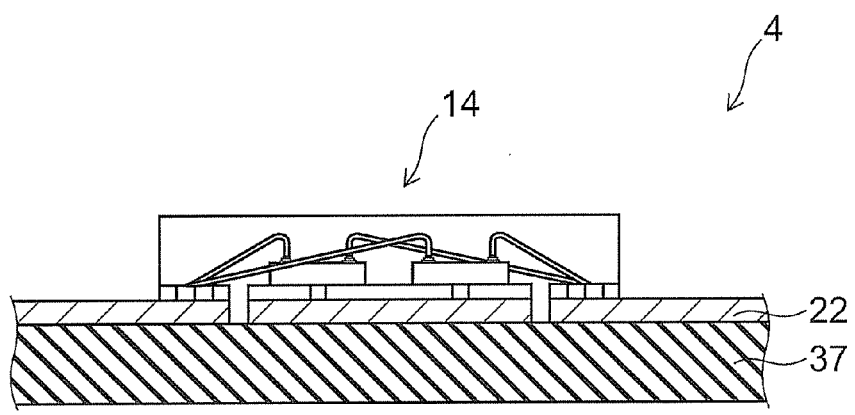
FIG. 14 is a sectional view illustrating an LED module according to a fourth embodiment.

FIG. 14 is a sectional view for illustrating an LED module according to this embodiment.

Figure 15:
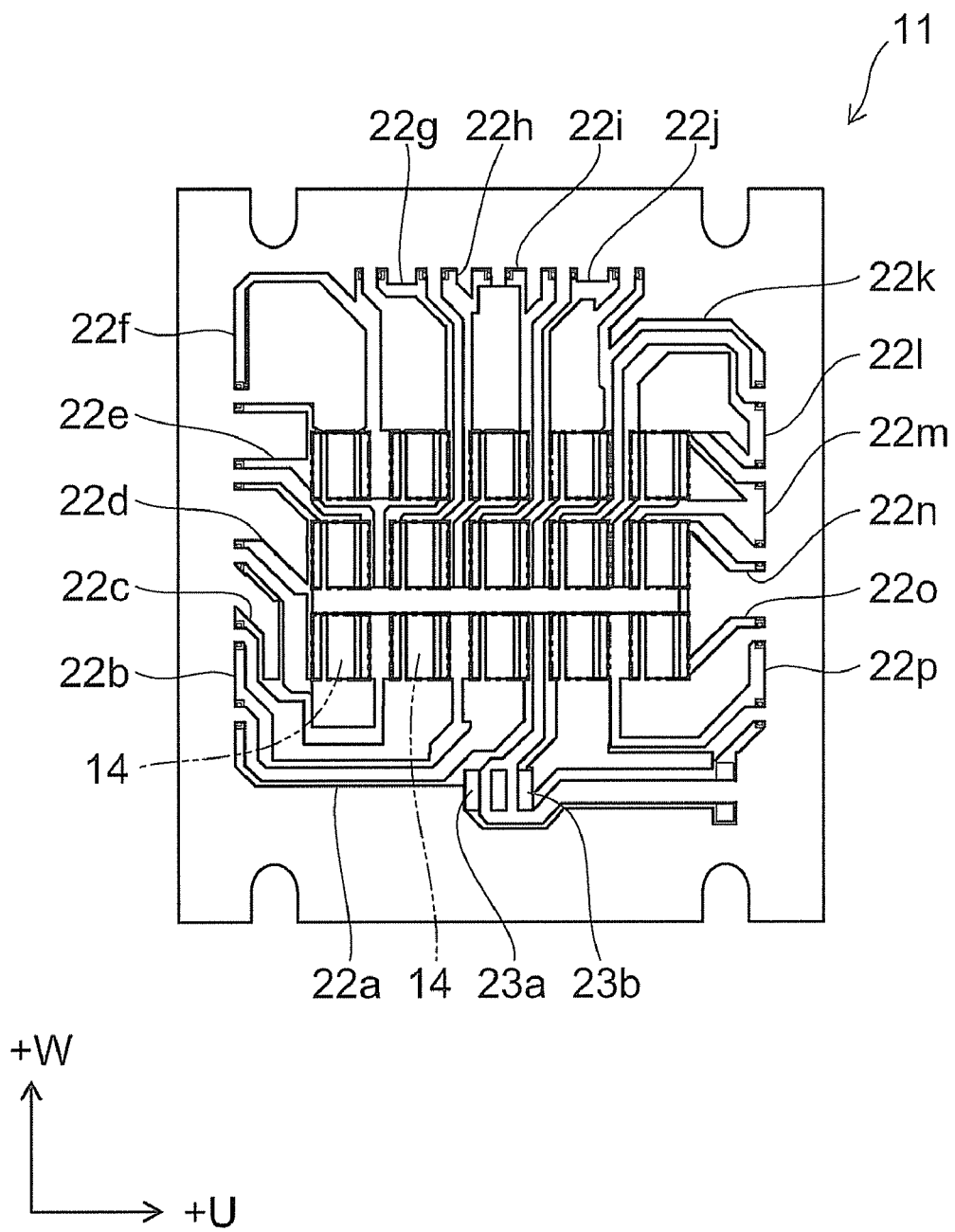
FIG. 15 is a plan view illustrating a printed board of the LED module according to the fourth embodiment.

FIG. 15 is a plan view for illustrating a printed board of the LED module according to this embodiment.

As shown in FIG. 14, an LED module 4 according to this embodiment is different from the above-described LED module 1 according to the first embodiment (see FIG. 4) in that a ceramic board 37 is provided instead of the resin board 21 (see FIG. 4). The ceramic board 37 is formed of a white ceramic material, for example, a ceramic material having a reflectivity of 90% or higher with respect to light having a wavelength of 465 nm. As an example, the ceramic board 37 is formed of alumina, for example, A476A manufactured by KYOCERA Corporation. In the LED module 4 according to this embodiment, no reflection film 13 (see FIG. 4) is provided. As shown in FIG. 15, the widths of the parts 22*a* to 22*p* of the interconnection 22 in this embodiment are narrower than those in the above-described first embodiment (see FIG. 2). Moreover, no parts 22*q* to 22*z* (see FIG. 2) are provided.

In this embodiment, the base material of the printed board is formed of the ceramic board 37. Accordingly, in comparison with the above-described first embodiment using the resin board 21, the thermal conductivity of the printed board is improved, and the heat dissipation properties of the LED module are improved. Moreover, in comparison with the above-described third embodiment, the cost for the printed board can be reduced. Furthermore, in this embodiment, by forming the ceramic board 37 with a white ceramic material, light emitted from the LED package 14 is reflected by the ceramic board 37. For this reason, the reflection film 13 (see FIG. 4) can be omitted, and the cost for the LED module is further reduced. Still furthermore, in this embodiment, by narrowing the widths of the parts 22*a* to 22*z* of the interconnection 22 as shown in FIG. 15, an exposed area of the ceramic board 37 is increased, and the light utilization efficiency is increased. Configuration, manufacturing method, effects, and advantages, other than the above, of this embodiment are the same as those of the above-described first embodiment.

Next, the fifth embodiment will be described.

Figure 16A:
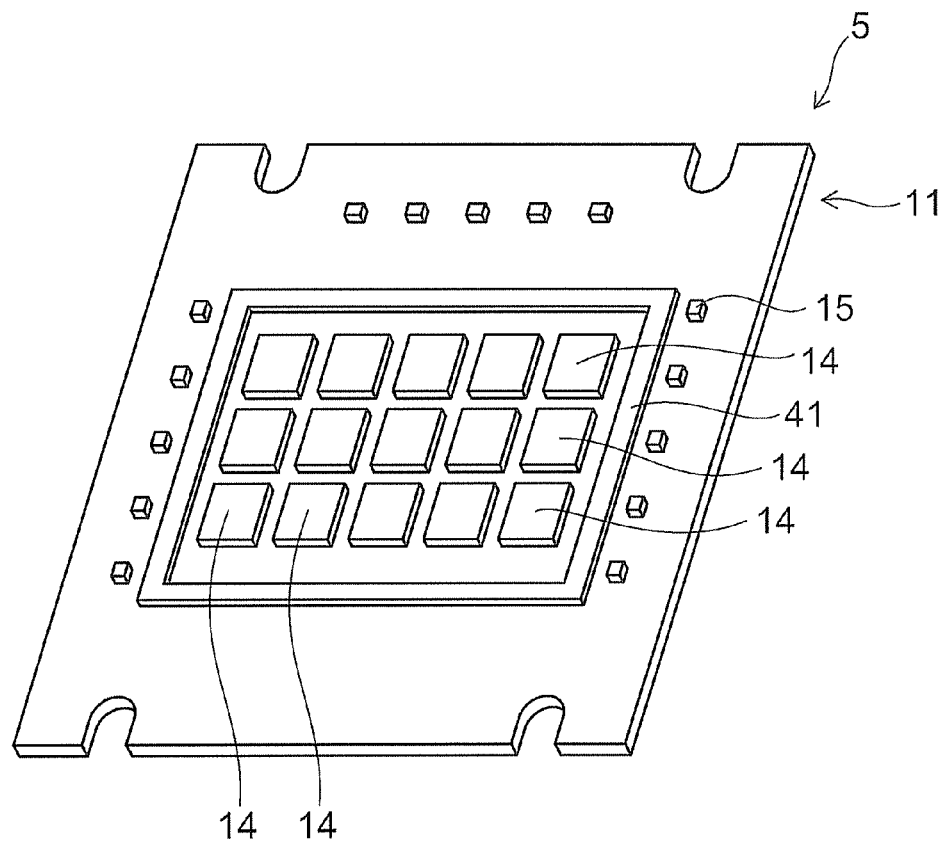
FIG. 16A is a perspective view illustrating an LED module according to a fifth embodiment.
Figure 16B:
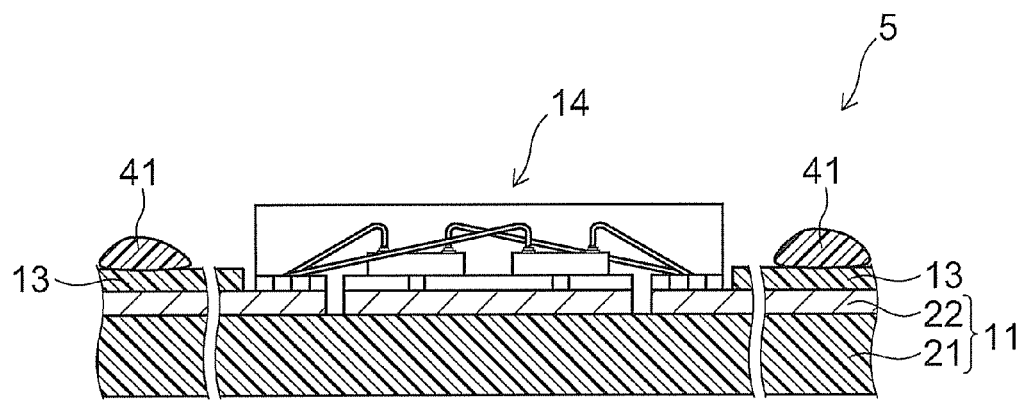
FIG. 16B is a sectional view illustrating the LED module according to this embodiment.

FIG. 16A is a perspective view for illustrating an LED module according to this embodiment. FIG. 16B is a sectional view for illustrating the LED module according to this embodiment.

As shown in FIGS. 16A and 16B, an LED module 5 according to this embodiment includes a frame member 41 in addition to the configuration of the above-described LED module 1 according to the first embodiment (see FIG. 1). The frame member 41 is provided on the printed board 11, and mounted higher than the upper surface of the printed board 11. Moreover, the frame member 41 is formed around a region where the 15 LED packages 14 are disposed, and is in the shape of a frame surrounding the region. The frame member 41 is formed of a white resin material, for example, a material obtained by dispersing a filler made of titanium oxide in a silicone resin.

According to this embodiment, light emitted sideward from the LED packages 14 is reflected upward at a side surface of the frame member 41. Thus, the light distribution characteristics of the LED module are enhanced. Configuration, manufacturing method, effects, and advantages, other than the above, of this embodiment are the same as those of the above-described first embodiment.

Next, a sixth embodiment will be described.

Figure 17A:
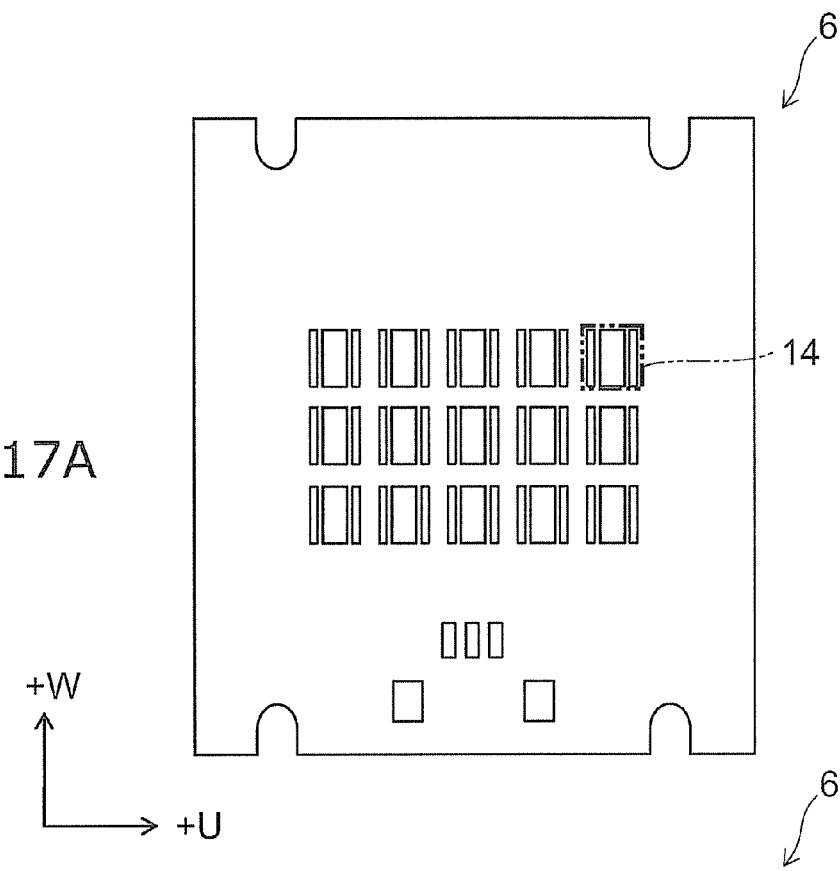
FIG. 17A is a plan view illustrating an LED module according to a sixth embodiment.
Figure 17B:
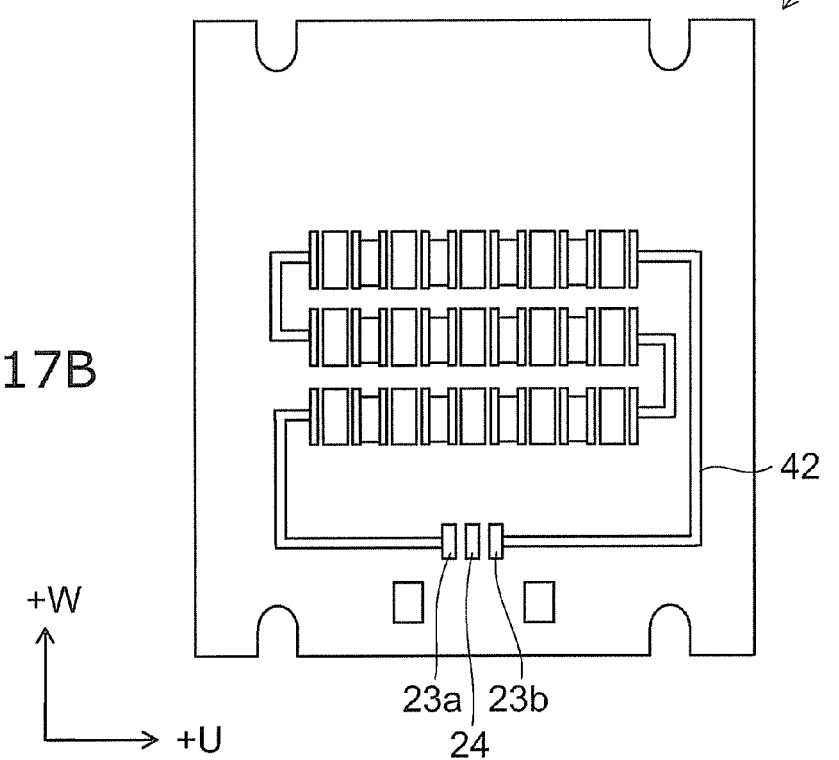
FIG. 17B is a plan view illustrating a printed board of the LED module according to this embodiment.

FIG. 17A is a plan view for illustrating an LED module according to this embodiment. FIG. 17B is a plan view for illustrating a printed board of the LED module according to this embodiment.

In FIG. 17B, an interconnection 42 of the printed board is schematically shown.

As shown in FIGS. 17A and 17B, in an LED module 6 according to this embodiment, no Zener diode package is provided, and 15 LED packages 14 are connected in series. For this reason, the layout of interconnection 42 is simplified. Note that, a Zener diode chip may be mounted in each of the LED packages 14. Configuration, manufacturing method, effects, and advantages, other than the above, of this embodiment are the same as those of the above-described first embodiment.

Next, a first modification of the sixth embodiment will be described.

Figure 18A:
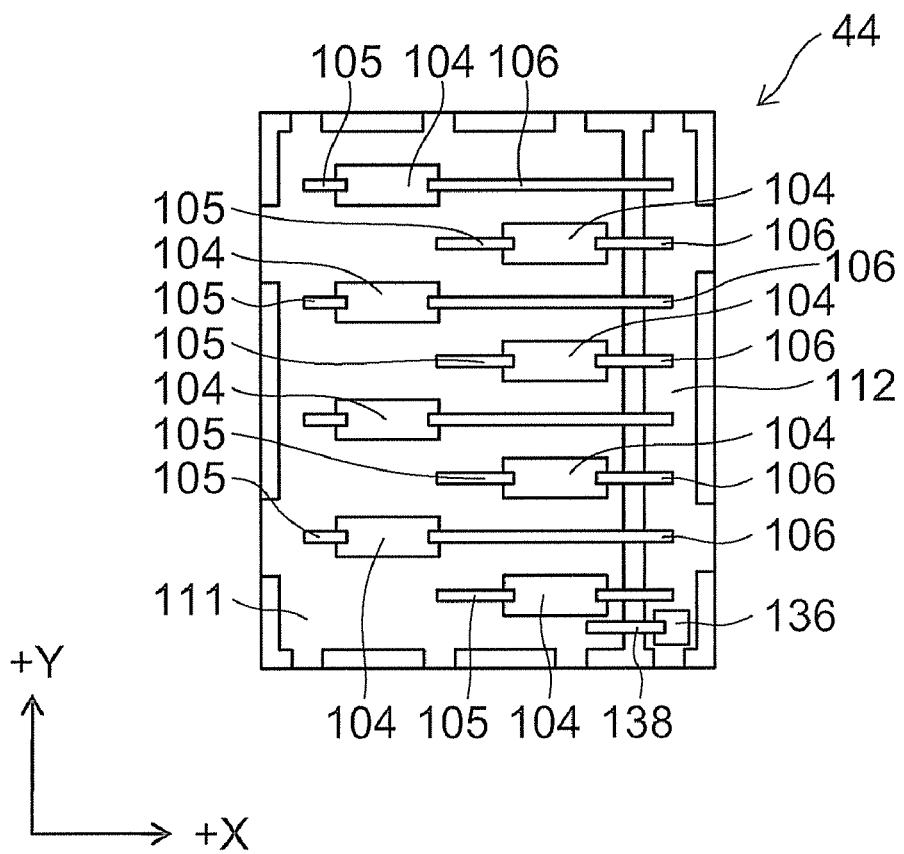
FIG. 18A is a plan view illustrating an LED package of a first variation of the sixth embodiment.
Figure 18B:
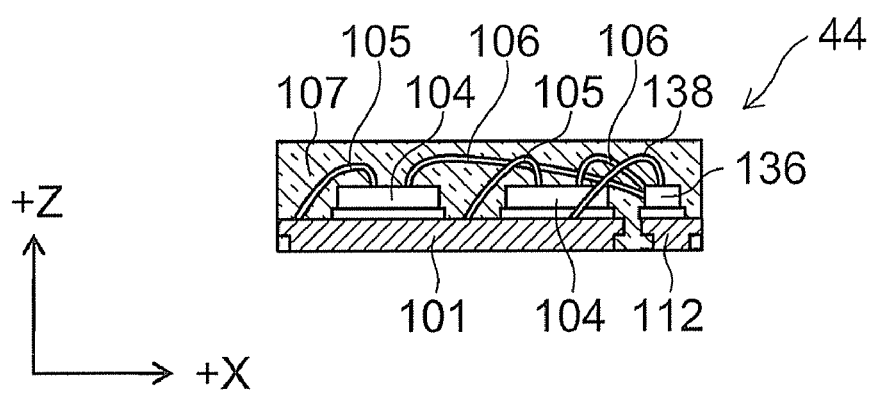
FIG. 18B is a sectional view thereof.

FIG. 18A is a plan view for illustrating an LED package of this modification, and FIG. 18B is a sectional view thereof.

As shown in FIGS. 18A and 18B, this modification is different from the above-described sixth embodiment (see FIG. 17) in configuration of an LED package 44. Specifically, the LED package 44 includes two lead frames 111 and 112, and the LED chips 104 are mounted on the lead frame 111. One terminal of each of the LED chips 104 is connected to the lead frame 111, while the other terminal thereof is connected to the lead frame 112. A Zener diode chip 136 is mounted on the lead frame 112. An upper surface terminal of the Zener diode chip 136 is connected to the lead frame 111 through a wire 138, while a lower surface terminal thereof is connected to the lead frame 112 with a die mounting member (unillustrated) interposed therebetween. According to this modification, the Zener diode chip is mountable on each LED package. Configuration, manufacturing method, effects, and advantages, other than the above, of this embodiment are the same as those of the above-described sixth embodiment.

Second to sixth modifications of the sixth embodiment below are examples of arrangement of the LED packages altered from that in the sixth embodiment.

FIGS. 19A to 20C are plan views for illustrating printed boards in the second to sixth modifications of the sixth embodiment.

Figure 19A:
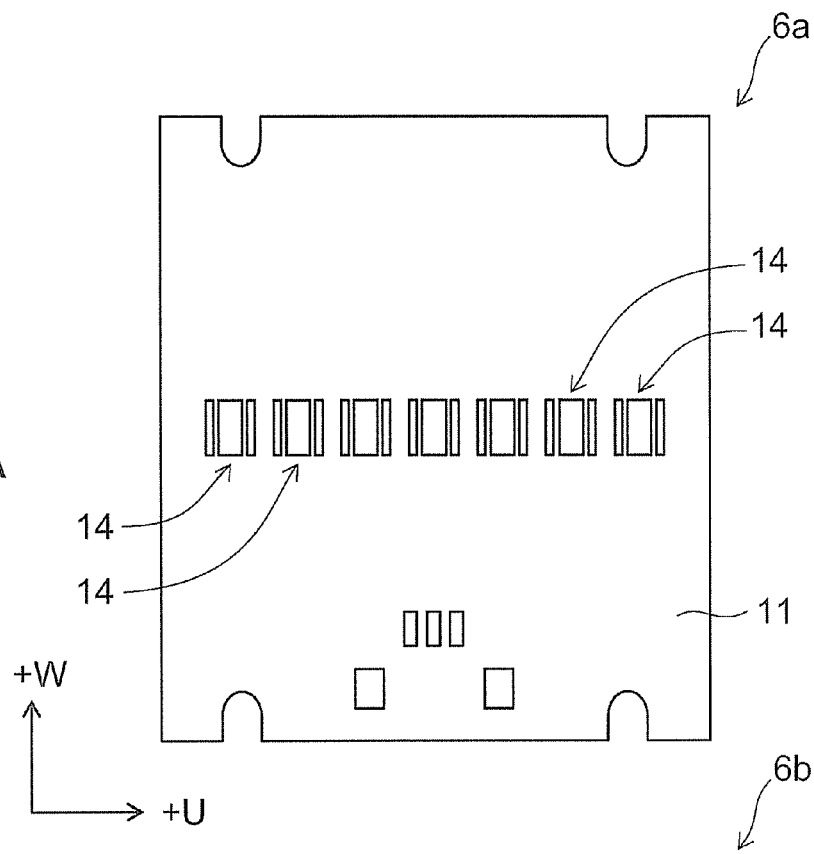
FIG. 19A is a plan view illustrating a printed board of a third variation of the sixth embodiment.

As shown in FIG. 19A, in an LED module 6a according to the second modification of the sixth embodiment, the seven LED packages 14 are arranged in one row along the U direction.

Figure 19B:
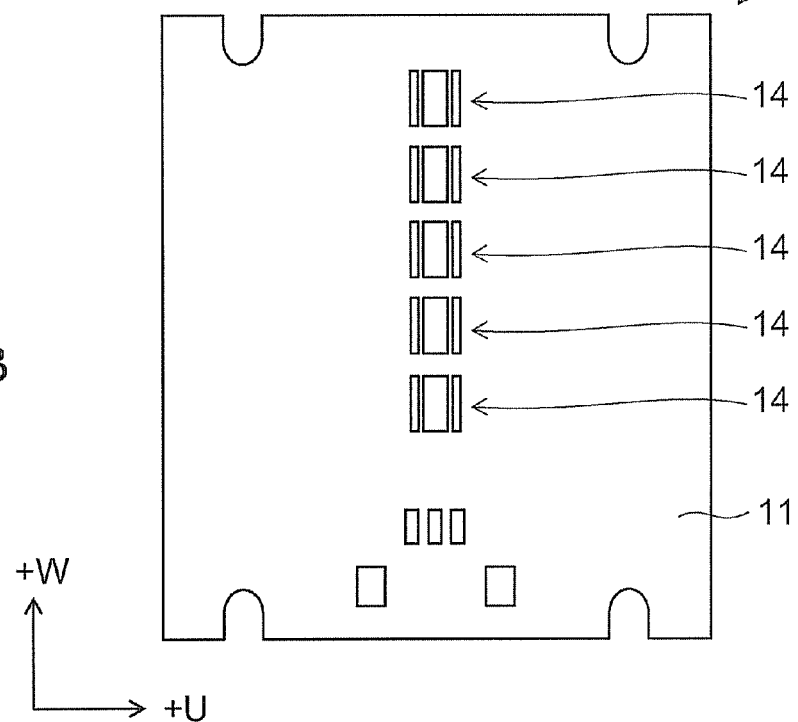
FIG. 19B is a plan view illustrating a printed board of a second variation of the sixth embodiment.

As shown in FIG. 19B, in an LED module 6b according to the third modification of the sixth embodiment, the five LED packages 14 are arranged in one row along the W direction.

Figure 20A:
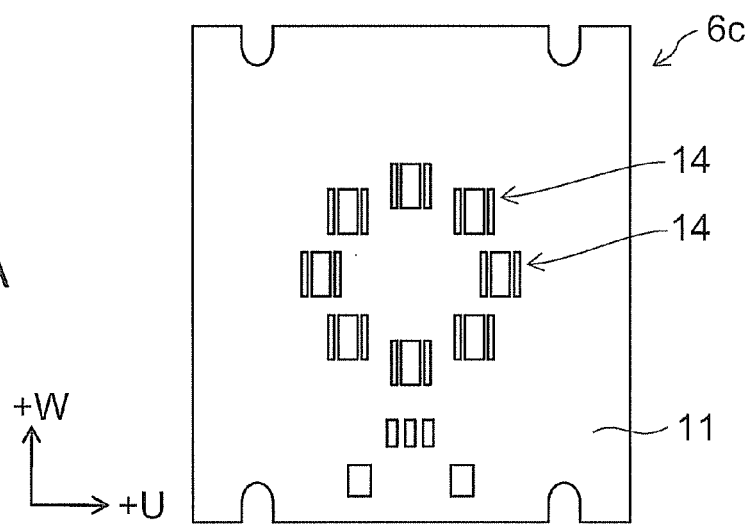
FIG. 20A is a plan view illustrating a printed board of a fourth variation of the sixth embodiment.

As shown in FIG. 20A, in an LED module 6c according to the fourth modification of the sixth embodiment, the eight LED packages 14 are arranged along the circumference. Each of the LED packages 14 is mounted in the same direction as the others. The direction (+X direction) from the lead frame 101 (see FIG. 5) to the lead frame 103 (see FIG. 5) coincides with the +U direction. According to this modification, since the LED packages are arranged along the circumference, the LED module emits light isotropically, and the intensity distribution of the emitted light is symmetrical with respect to the +Z direction.

Figure 20B:
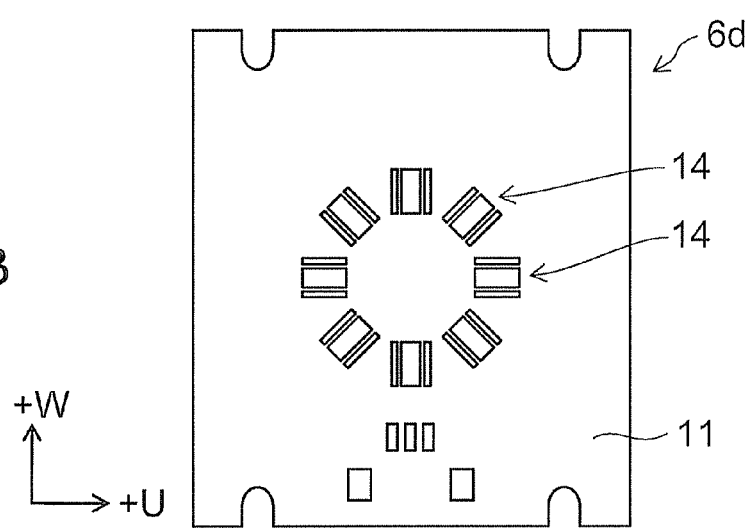
FIG. 20B is a plan view illustrating a printed board of a fifth variation of the sixth embodiment.

As shown in FIG. 20B, in an LED module 6d according to the fifth modification of the sixth embodiment, the eight LED packages 14 are arranged along the circumference. Each of the LED packages 14 is mounted in a direction different from those of the others. The direction from the lead frame 101 (see FIG. 5) to the lead frame 103 (see FIG. 5) coincides with the circumferential direction of a circle formed by the eight LED packages 14. In this manner, the intensity distribution of the emitted light is symmetrical with respect to the +Z direction.

Figure 20C:
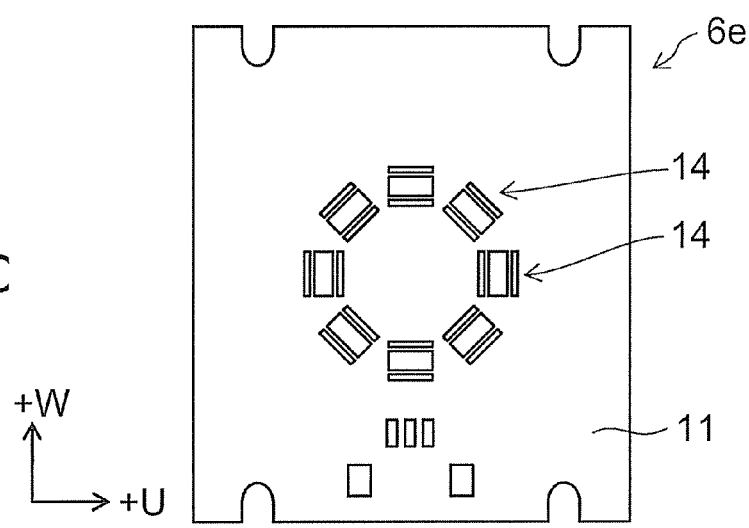
FIG. 20C is a plan view illustrating a printed board of a sixth variation of the sixth embodiment.

As shown in FIG. 20C, in an LED module 6e according to the sixth modification of the sixth embodiment, the eight LED packages 14 are arranged along the circumference. Each of the LED packages 14 is mounted in a direction different from those of the others. The direction from the lead frame 101 (see FIG. 5) to the lead frame 103 (see FIG. 5) coincides with the radial direction of a circle formed by the eight LED packages 14. In this manner also, the intensity distribution of the emitted light is made symmetrical.

Configuration, manufacturing method, effects, and advantages, other than the above, of the aforementioned second to sixth modifications are the same as those of the above-described sixth embodiment.

Next, a seventh embodiment will be described.

This embodiment is a variation of a method for forming a lead frame sheet of the LED package in the above-described first embodiment.

Specifically, in this embodiment, the method for forming the lead frame sheet shown in FIG. 6A is different from that in the above-described first embodiment.

FIGS. 21A to 21H are process sectional views for illustrating the method for forming a lead frame sheet of this embodiment.

Figure 21A:
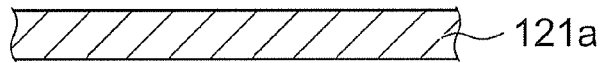
FIGS. 21A to 21H are process sectional views illustrating a method for forming a lead frame sheet of a seventh embodiment.
Figure 21B:
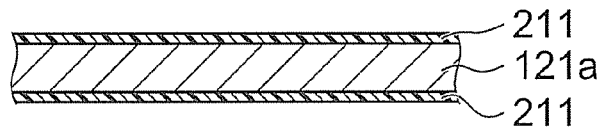
Figure 21C:
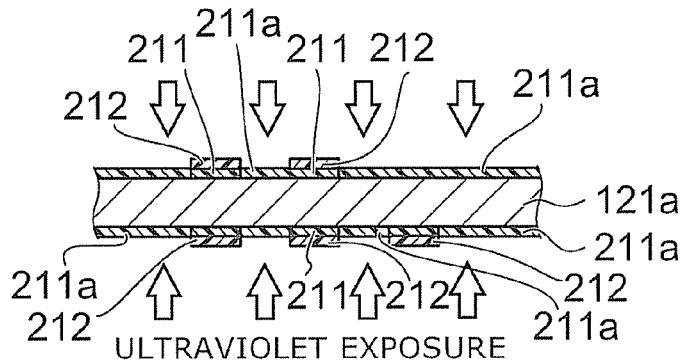
Figure 21D:
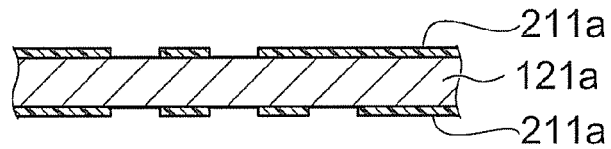
Figure 21E:
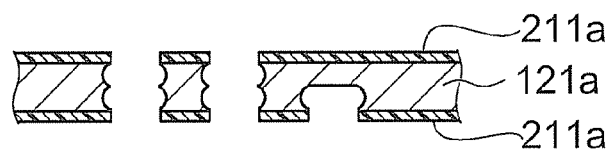
Figure 21F:
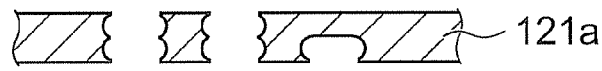
Figure 21G:
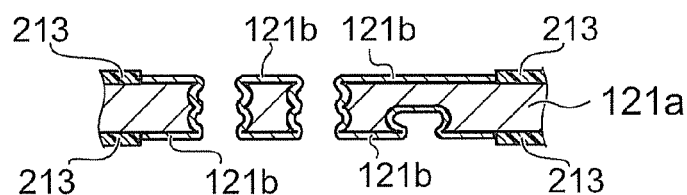
Figure 21H:
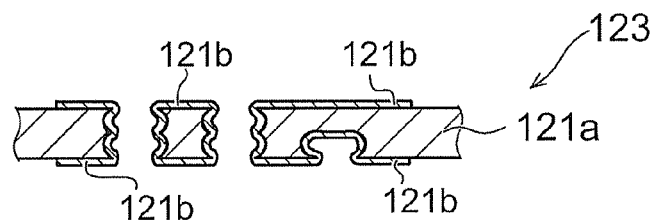

First, a copper plate 121a is prepared as shown in FIG. 21A, and cleaned. Next, as shown in FIG. 21B, both surfaces of the copper plate 121a are coated with a resist and then dried to form resist films 211. Next, as shown in FIG. 21C, mask patterns 212 are disposed on the resist films 211, and subjected to exposure with ultraviolet irradiation. Thereby, exposed portions of the resist films 211 are cured, and resist masks 211a are formed. Next, as shown in FIG. 21D, development is performed, and non-cured portions of the resist films 211 are washed away. Thereby, the resist patterns 211a are left remained on the upper and lower surfaces of the copper plate 121a. Next, as shown in FIG. 21E, using the resist patterns 211a as a mask, etching is performed to remove exposed portions of the copper plate 121a from both surfaces. In this event, the etching depth is approximately half the thickness of the copper plate 121a. Thereby, a region etched only from one surface side is half-etched, while a region etched from both surface sides is penetrated. Next, as shown in FIG. 21F, the resist patterns 211a are removed. Next, as shown in FIG. 21G, end portions of the copper plate 121a are covered with masks 213, and then plated. Thereby, silver plated layers 121b are formed on surfaces of portions, other than the end portions, of the copper plate 121a. Next, as shown in FIG. 21H, the resultant is cleaned, and the masks 213 are removed. After that, inspection is performed. In this manner, a lead frame sheet 123 is formed. Configuration, manufacturing method, effects, and advantages, other than the above, of this variation are the same as those of the above-described first embodiment.

Next, an eighth embodiment will be described.

This embodiment is an example of a manufacturing method in which the number of the LED chips 104 mounted on one LED package 14 is changed from that in the above-described first embodiment.

Figure 22A:
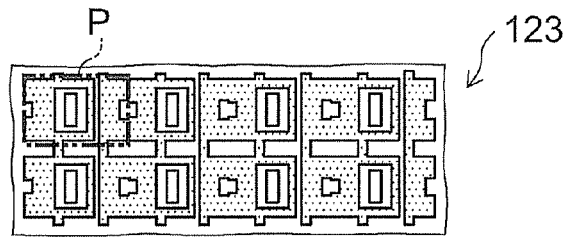
FIGS. 22A to 22E are plan views illustrating an element region of a lead frame sheet used in an eighth embodiment.
Figure 22B:
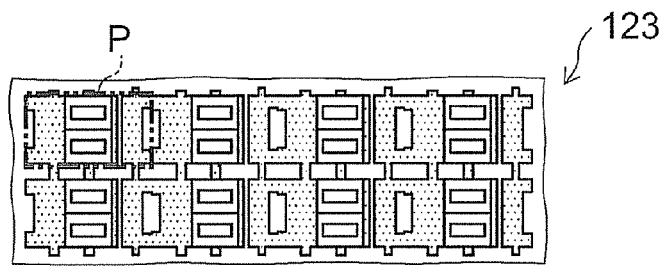
Figure 22C:
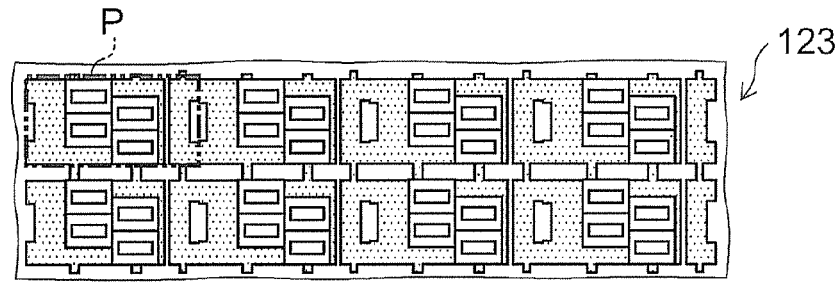
Figure 22D:
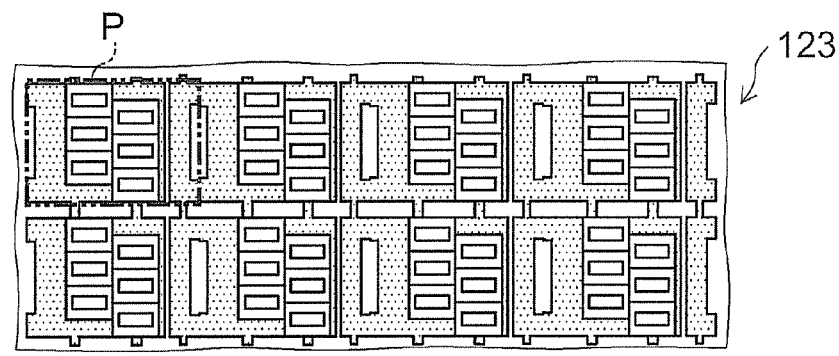
Figure 22E:
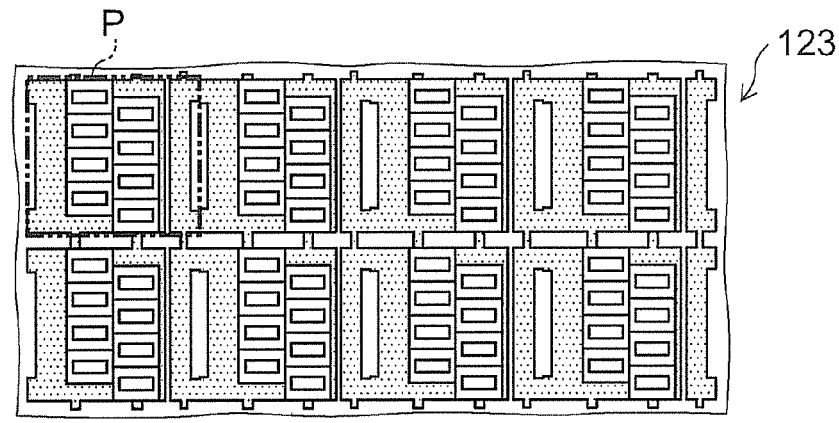

FIGS. 22A to 22E are plan views for illustrating an element region of a lead frame sheet used in this embodiment. FIG. 22A illustrates a case where one LED chip is mounted on one LED package. FIG. 22B illustrates a case where two LED chips are mounted. FIG. 22C illustrates a case where four LED chips are mounted. FIG. 22D illustrates a case where six LED chips are mounted. FIG. 22E illustrates a case where eight LED chips are mounted.

FIGS. 22A to 22E are drawings on the same scale. Although only one element region P is illustrated in each drawing, multiple element regions P are actually arranged in a matrix pattern. Furthermore, the illustration of the dicing region D is omitted. Still furthermore, in this embodiment, illustrated is a case where two lead frames are formed in each LED package.

As shown in FIGS. 22A to 22E, the larger the number of the LED chips mounted on one LED package, the larger the area of one element region P becomes. Accordingly, the number of the element regions P included in one block B is reduced. However, even if the number of the LED chips is changed, the basic structure of the lead frame sheet 123, i.e., the size of the lead frame sheet 123, the arrangement of the blocks B, and so forth, is the same. Moreover, the method for forming the lead frame sheet 123 and the method for manufacturing an LED package using the lead frame sheet 123 are the same. What is changed is merely the layout within the block B.

In this manner, according to this embodiment, the LED packages each having the different number of the LED chips mounted thereon are manufactured only by altering the layout within each block B of the lead frame sheet 123. Note that the number of LED chips mounted on one LED package is any number. For example, the number may be 7, 9 or larger.

Next, a ninth embodiment will be described.

The ninth embodiment and the following tenth embodiment are embodiments of a light fixture in which the LED module according to the above-described first to eighth embodiments is incorporated.

Figure 23:
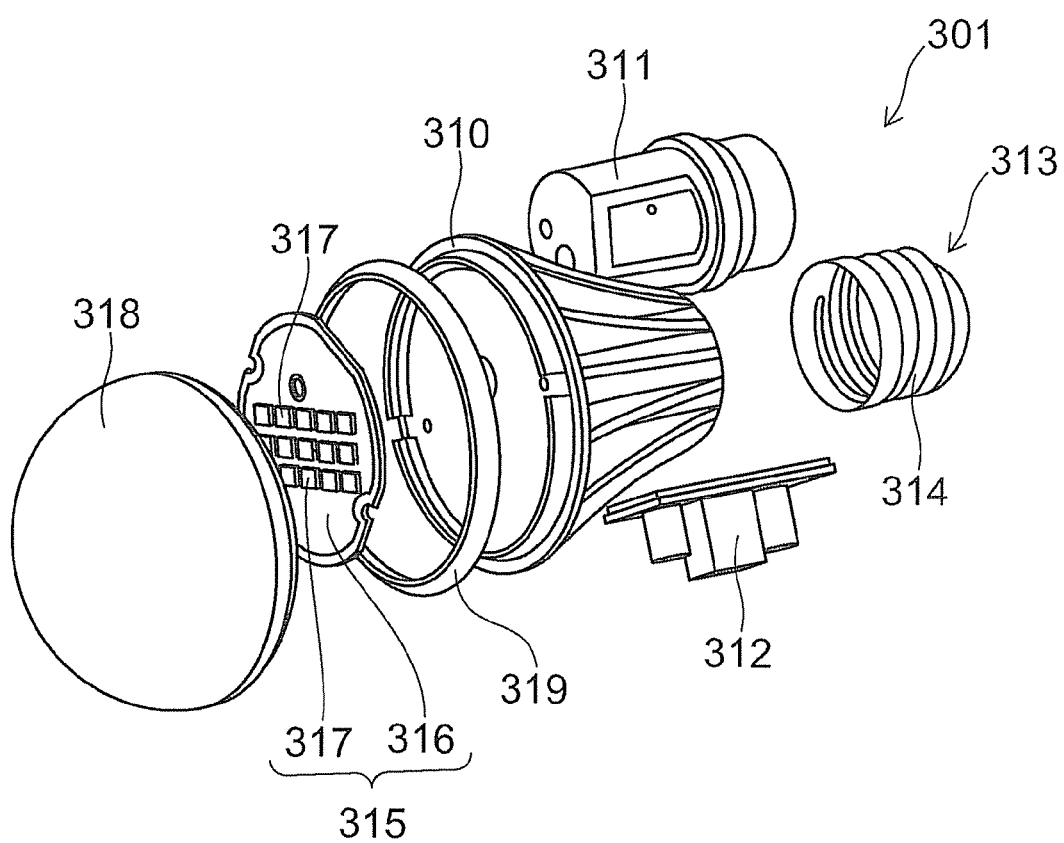
FIG. 23 is an exploded perspective view illustrating a light bulb light fixture according to a ninth embodiment.

FIG. 23 is an exploded perspective view for illustrating a light bulb light fixture according to this embodiment.

As shown in FIG. 23, the shape and size of a light bulb light fixture 301 according to this embodiment as a whole are equivalent to those of conventional PS-shaped incandescent light bulbs.

The light bulb light fixture 301 includes a casing 310 having a shape of substantially circular truncated cone. The diameter of the casing 310 is reduced toward the rear side. The casing 310 is formed of a material having favorable heat dissipation properties. A cylindrical inner casing 311 is housed in the casing 310, and a circuit board 312 is housed in the inner casing 311. The circuit board 312 is an AC-DC converter for converting an alternating current to a direct current. A cap 313 is attached to a rear end portion of the casing 310. The cap 313 serves as both a rear cover and a power input terminal of the light bulb light fixture 301. The cap 313 is formed of a conductive material, and is connected to the circuit board 312. A screw thread 314 is formed on an outer surface of the cap 313. The shape of the screw thread 314 is a standardized shape, which is the same as the shape of a screw thread formed on a cap of a conventional incandescent light bulb.

Moreover, an LED module 315 is attached to a front edge surface of the casing 310. The LED module 315 is obtained by processing the printed board of the above-described LED module 1 according to the first embodiment (see FIG. 1) so that the appearance of the printed board can fit to the casing 310. In the LED module 315, for example, 15 LED packages 317 are mounted on a board 316. The LED module 315 is attached to the casing 310 in a way that the LED packages 317 are arranged on the front side of the light bulb light fixture 301 when seen from the board 316. Thus, a light emitting surface of the LED module 315 faces forward of the light bulb light fixture 301. A direct current is supplied to the LED module 315 from the circuit board 312. The board 316 is thermally connected to the casing 310.

Furthermore, the light bulb light fixture 301 includes a semi-spherical cover 318. The cover 318 is formed of a transparent or translucent material. The cover 318 is attached to a front edge portion of the casing 310 with an annular stopper 319 in such a way as to cover the LED module 315. Thus, the outer surface of the light bulb light fixture 301 is formed of the cap 313, the casing 310, the stopper 319 and the cover 318.

In the light bulb light fixture 301 according to this embodiment, the screw thread 314 formed on the cap 313 has a standardized shape. The entire shape of the light fixture 301 is also equivalent to those of conventional incandescent light bulbs. The circuit board 312 converts an alternating current, which is supplied from the outside, to a direct current, and supplies the current to the LED module 315. For this reason, the light fixture 301 can be used while provided to a socket to which a conventional incandescent light bulb is provided. In other words, the light bulb light fixture 301 is compatible with a conventional incandescent light bulb. Moreover, since the LED module 315 is mounted in the light bulb light fixture 301, the light emission efficiency is higher than that of an incandescent light bulb, and the same amount of light is obtained with less power. In addition, the LED module has a higher durability and a longer life than an incandescent light bulb, and the LED module is not replaced frequently. Particularly, since the above-described LED module according to the first embodiment is incorporated in the light bulb light fixture according to this embodiment, the durability is particularly high, and the cost is low.

Next, a tenth embodiment will be described.

Figure 24:
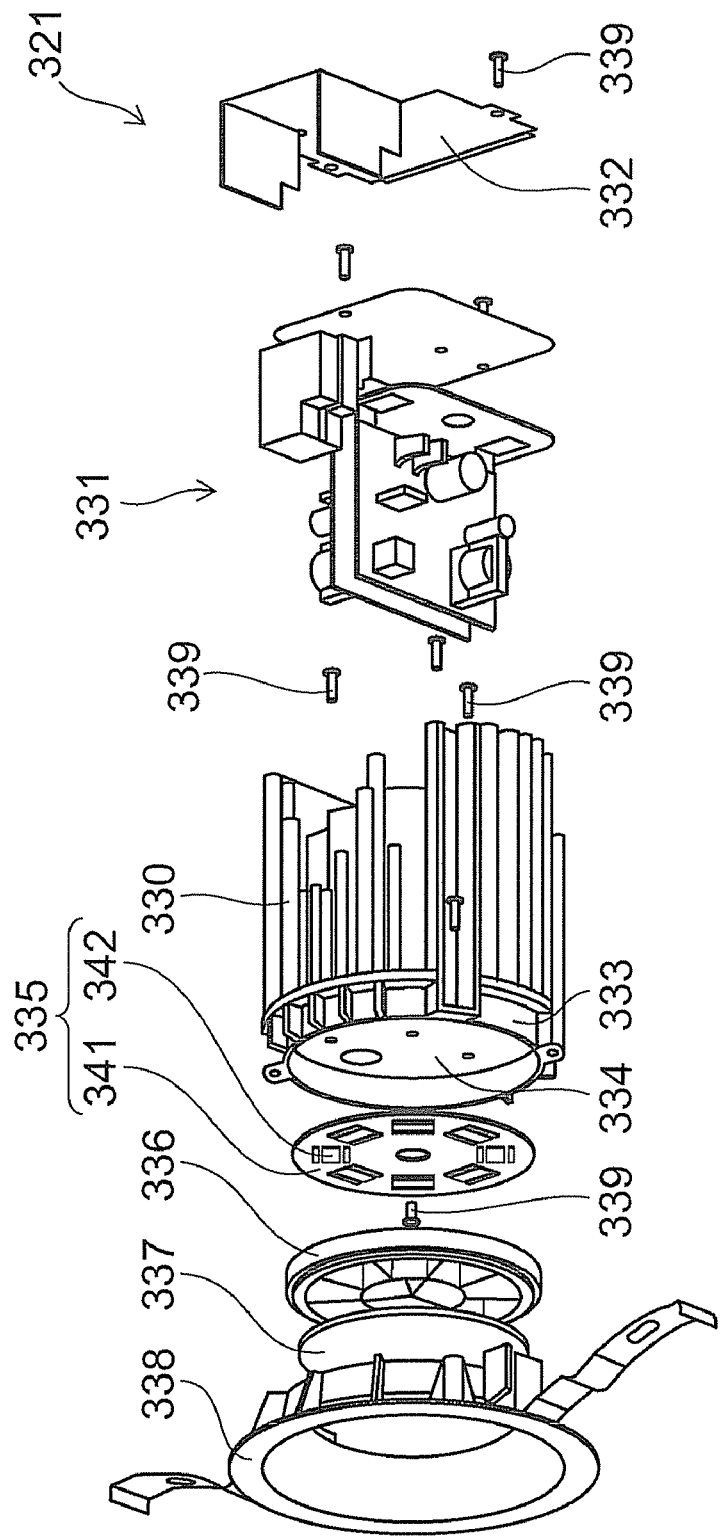
FIG. 24 is an exploded perspective view illustrating a downlight light fixture according to a tenth embodiment.

FIG. 24 is an exploded perspective view for illustrating a downlight light fixture according to this embodiment.

As shown in FIG. 24, a downlight light fixture 321 includes a casing 330 having a substantially cylindrical shape. The casing 330 is formed of a material having favorable heat dissipation properties. A lighting circuit 331 is housed in the casing 330. The lighting circuit 331 is a circuit for converting an inputted alternating current to a direct current for output. A planar rear cover 332 is attached to a rear end portion of the casing 330.

An annular extending part 333 is formed at a peripheral portion of a front end portion of the casing 330, and a flat plate part 334 is formed inside the extending part 333. The extending part 333 is formed as a portion of a side surface of the casing 330 extending forward. The flat plate part 334 is positioned rearward of a front end portion of the extending part 333. An LED module 335 is attached to a front surface of the flat plate part 334. The LED module 335 is obtained by processing the printed board 11 of the above-described LED module 6e according to the sixth modifications of the sixth embodiment (see FIG. 20C) so that the appearance of the printed board can be altered into a circular form in accordance with the casing 330. For example, eight LED packages 342 are arranged along the circumference on a board 341. The LED module 335 is disposed in a way that a light emitting surface thereof faces forward of the downlight light fixture 321. A direct current is supplied to the LED module 335 from the lighting circuit 331. The board of the LED module 335 is thermally connected to the casing 330.

Furthermore, diffusion plates 336 and 337 are provided in front of the LED module 335. The diffusion plates 336 and 337 are housed in the extending part 333 of the casing 330. Still furthermore, an annular front cover 338 is provided at a front end portion of the casing 330. The front cover 338 fits to the extending part 333, and thereby is fixed to the casing 330. The LED module 335 and the diffusion plates 336 and 337 are sandwiched between the flat plate part 334 and the front cover 338. The aforementioned members are connected to each other with multiple screws 339. The entire shape and size of the downlight light fixture 321 are equivalent to the shape and size of a conventional downlight using an incandescent light bulb or a fluorescent lamp. The light fixture 321 is compatible with a conventional downlight.

The downlight light fixture 321 according to this embodiment can be used in place of a conventional downlight. Moreover, since the LED module 335 is mounted in the downlight light fixture 321, the light emission efficiency is higher than that of a downlight using an incandescent light bulb or a phosphor, and the same amount of light is obtained with less power. In addition, the durability is higher and the lifetime is longer. Particularly, since the above-described LED module according to the sixth modification of the sixth embodiment is incorporated in the downlight light fixture according to this embodiment, the durability is particularly high, and the cost is low.

Note that in the above-described ninth and tenth embodiments, it is possible to use, as the LED module, any LED module among the LED modules according to the above-described first to sixth embodiments and the modifications thereof. Moreover, in the above-described ninth and tenth embodiments, examples have been shown that the light fixtures in which the LED modules are mounted are the light bulb light fixture and the downlight light fixture. However, the invention is not limited thereto. The LED module according to the invention is applicable to light source devices in any forms such as light fixtures and other forms. For example, the LED module according to the invention may be used as a backlight of a liquid crystal display and as a fog lamp of an automobile. In this case, the entire shape and size should be equivalent to the shape and size of the corresponding conventional light source device, and the shape of the power input terminal should be standardized shape. Accordingly, the LED module can have a compatibility with conventional light source devices. Additionally, since having the AC-DC converter built therein, the LED module can be used by itself without providing a specialized external adaptor even in environments where, for example, an alternating current from household power sources and the like is supplied.

Next, a test example will be described.

Figure 25:
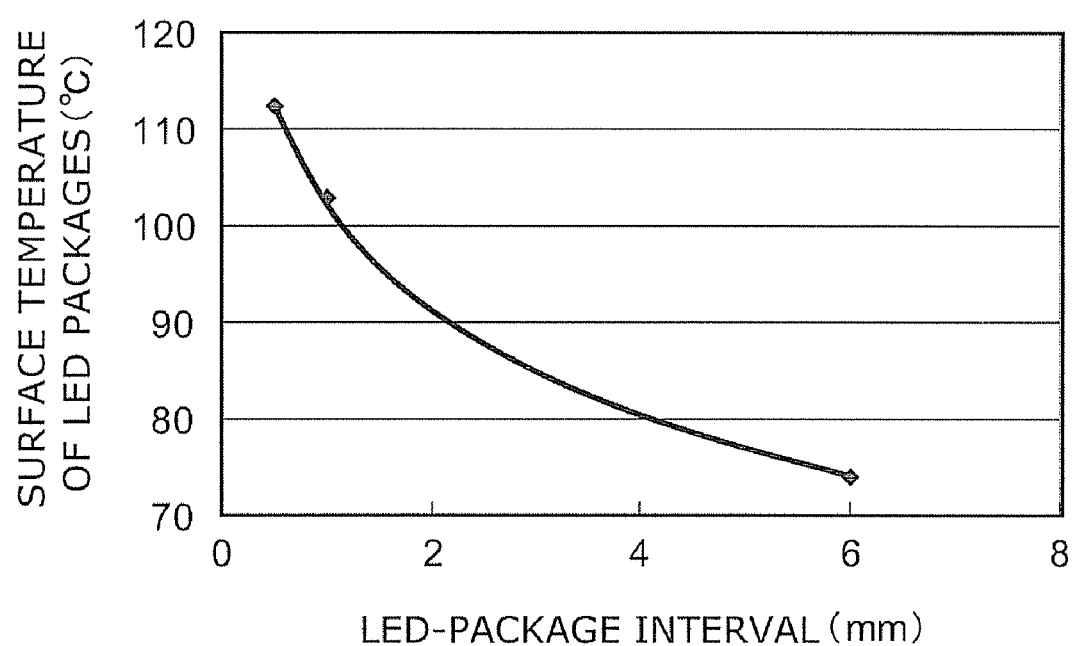
FIG. 25 is a graph illustrating how the LED-package interval influences an increase in temperature, with the horizontal axis indicating the LED-package interval, and the vertical axis indicating the surface temperature of the LED packages.

FIG. 25 is a graph for illustrating how the LED-package interval influences an increase in temperature, with the horizontal axis indicating the LED-package interval, and the vertical axis indicating the surface temperature of the LED packages.

In this test example, multiple LED modules were manufactured by the above-described method in the first embodiment. LED packages were disposed at intervals different in one of the LED modules from the others. Then, a power was applied to each of the LED modules, and the surface temperature of the LED packages was measured. In this event, when a temperature was stabilized after the initiation of the energization, the temperature was recorded on the vertical axis of FIG. 25 as the temperature in the steady state.

As shown in FIG. 25, the smaller the interval between the LED packages, the higher the surface temperature of the LED packages became. When the interval between the LED packages was set smaller than 1 mm, the temperature increased drastically.

Although the invention has been described with reference to the embodiments and variations, the invention is not limited to these embodiments and variations. Each of the above-described embodiments and variations can be implemented in combination with the other embodiments and variations. Moreover, those obtained through design alteration, addition, or deletion of the components, or those obtained through condition alteration, addition, or omission of the processes, which will be made appropriately on the above-described embodiments and variations by those skilled in the art are included in the scope of the invention, as long as such variations include the gist of the invention.

For example, in the above-described first embodiment, an example has been shown that the lead frame sheet 23 is formed by wet-etching. However, the invention is not limited thereto. For example, the lead frame sheet 23 may be formed in a mechanical way such as pressing. Furthermore, in the above-described first embodiment, an example has been shown that the lead frame is a copper plate and a silver plated layer formed on the upper and lower surfaces of the copper plate. However, the invention is not limited thereto. For example, a rhodium (Rh) plated layer may be formed on at least one of silver plated layers respectively formed on the upper and lower surfaces of a copper plate. Alternatively, a copper (Cu) plated layer may be formed between a copper plate and a silver plated layer. Furthermore, a gold-silver alloy (Au—Ag alloy) plated layer may be formed on a nickel (Ni) plated layer formed on each of the upper and lower surfaces of a copper plate.

Still furthermore, in the above-described embodiments and variations, examples have been shown that the LED chip is a chip which emits blue light, that the phosphor is a phosphor which absorbs blue color and emits yellow light, and that the color of light emitted from the LED package is white. However, the invention is not limited thereto. The LED chip may emit visible light of any color other than blue, or may emit ultraviolet light or infrared radiation. The phosphor is not limited to the phosphor which emits yellow light. For example, the phosphor may emit blue light, green light, or red light.

Still furthermore, in the above-described embodiments and variations, examples have been shown that the base portion of the lead frame has a rectangular shape when seen from above. However, the base portion may have a shape that at least one corner thereof is cut off. Thereby, the corner of the lead frame with a right angle or an acute angle is not provided around corners of the LED package. And the chamfered corner will not serve as the origin of resin peeling and crack of the transparent resin body. As a result, the incidences of resin peeling and crack are suppressed in the LED package as a whole.

According to the above-described embodiments, an LED module high in durability and low in cost and a method for manufacturing the same are provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An LED module comprising:
   a board;
   an interconnection formed on an upper surface of the board; and
   a plurality of LED packages mounted on a central region of the board,
   each of the LED packages including:
   first and second lead frames disposed to be apart from each other, and connected to portions of the interconnection insulated from each other;

an LED chip provided above the first and second lead frames, the LED chip having one terminal connected to the first lead frame and another terminal connected to the second lead frame; and a resin body covering an upper surface, a portion of a lower surface, and a portion of an edge surface of each of the first and second lead frames, also covering the LED chip, but exposing a remaining portion of the lower surface and a remaining portion of the edge surface, an appearance of the resin body being an appearance of the LED package, a first projected portion being formed at a lower surface of the first lead frame and a second projected portion being formed at a lower surface of the second lead frame, the first lead frame having a first edge and the second lead frame having a second edge, the first edge and the second edge facing each other, the first projected portion being formed in a region being apart from the first edge, and the second projected portion being formed in a region being apart from the second edge, a lower surface of the first projected portion and a lower surface of the second projected portion being exposed on a lower surface of the resin body, all of side surfaces of the first projected portion and all of side surfaces of the second projected portion being covered with the resin body, a lower surface of a first thin plate portion of the first lead frame and a lower surface of a second thin plate portion of the second lead frame being covered with the resin body, the first thin plate portion including the first edge and the second lead frame including the first second.

2. The module according to claim 1, wherein one of the first lead frame and the second lead frame includes:

a base portion; and three extending portions extending from the base portion in different directions from one another, and having lower surfaces covered with the resin body and edge surfaces exposed on side surfaces of the resin body, and edge surfaces of the base portion are covered with the resin body.

3. The module according to claim 2, wherein the base portion has a rectangular shape, and the three extending portions are disposed on a same plane, and respectively extend from three different side surfaces of the base portion.

4. The module according to claim 1, wherein the resin body has a rectangular shape, and one of the first lead frame and the second lead frame includes:

a base portion having edge surfaces covered with the resin body; and a plurality of extending portions extending from the base portion, and having lower surfaces covered with the resin body and edge surfaces each exposed on a corresponding one of three different side surfaces of the resin body.

5. The module according to claim 1, wherein both of the one terminal and the another terminal are provided on an upper surface of the LED chip, the LED package further includes:

a first wire connecting the one terminal to the first lead frame;

a second wire connecting the another terminal to the second lead frame; and a third lead frame disposed between the first lead frame and the second lead frame, a portion of a lower surface and a portion of an edge surface of the third lead frame are exposed on the resin body, and the LED chip is mounted on the third lead frame.

6. The module according to claim 1, wherein a plurality of the LED chips are provided in the LED package.

7. The module according to claim 6, wherein the plurality of LED chips are arranged in a zigzag alignment.

8. The module according to claim 1, further comprising a Zener diode mounted on the board, and connected in parallel to the LED package.

9. The module according to claim 8, wherein a plurality of the Zener diodes are mounted on the board, and the plurality of Zener diodes are disposed in a peripheral region of the board.

10. The module according to claim 1, wherein the board is formed of a resin material.

11. The module according to claim 1, wherein the board includes:

a metal base layer; and an insulating layer provided on the metal base layer.

12. The module according to claim 11, further comprising a penetration metal layer formed in and penetrating the insulating layer.

13. The module according to claim 12, wherein the LED package further includes a third lead frame disposed between the first lead frame and the second lead frame, a portion of a lower surface and a portion of an edge surface of the third lead frame are exposed on the resin body, the LED chip is mounted on the third lead frame, and the penetration metal layer is connected to the metal base layer, connected to the third lead frame through the interconnection, but not connected to the first and second lead frames.

14. The module according to claim 1, further comprising: a reflection film covering a portion of the board and a portion of the interconnection.

15. The module according to claim 1, wherein the board is formed of a white ceramic material.

16. The module according to claim 1, further comprising a frame member provided around a region on the board where the LED package is mounted.

17. The module according to claim 1, wherein silver plated layers formed on all regions of upper surfaces of the first and second lead frame.

* * * * *